US006480988B2

(12) United States Patent
Ganesan et al.

(10) Patent No.: US 6,480,988 B2
(45) Date of Patent: Nov. 12, 2002

(54) FUNCTIONAL VERIFICATION OF BOTH CYCLE-BASED AND NON-CYCLE BASED DESIGNS

(75) Inventors: Subbu Ganesan, Saratoga, CA (US); Leonid Alexander Broukhis, Fremont, CA (US); Ramesh Narayanaswamy, Mountain View, CA (US); Ian Michael Nixon, Sunnyvale, CA (US)

(73) Assignee: Tharas Systems, Inc., Santa Clara, CA (US)

( * ) Notice: Subject to any disclaimer, the term of this patent is extended or adjusted under 35 U.S.C. 154(b) by 125 days.

(21) Appl. No.: 09/738,273

(22) Filed: Dec. 14, 2000

(65) Prior Publication Data

US 2002/0112217 A1 Aug. 15, 2002

(51) Int. Cl.[7] .............................................. G06F 17/50
(52) U.S. Cl. ............................................. 716/5; 703/16
(58) Field of Search ...................... 716/1–18; 703/14–16

(56) References Cited

U.S. PATENT DOCUMENTS

| | | | | | |
|---|---|---|---|---|---|
| 5,625,567 A | * | 4/1997 | Mankin et al. | ................. | 716/3 |
| 5,682,321 A | * | 10/1997 | Ding et al. | ..................... | 716/8 |
| 5,796,623 A | * | 8/1998 | Butts et al. | .................... | 703/23 |
| 5,937,183 A | * | 8/1999 | Ashar et al. | .................... | 703/14 |
| 6,112,023 A | * | 8/2000 | Dave et al. | ..................... | 703/27 |
| 6,230,303 B1 | * | 5/2001 | Dave | ............................. | 716/7 |
| 6,295,517 B1 | * | 9/2001 | Roy et al. | ..................... | 703/15 |

* cited by examiner

Primary Examiner—Matthew Smith
Assistant Examiner—Phallaka Kik
(74) Attorney, Agent, or Firm—Law Firm of Naren Thappeta

(57) ABSTRACT

A functional verification system which can be used to evaluate either cycle based designs or non-cycle based designs. A target design is partitioned into multiple clusters, with a combinatorial block in each cluster being assigned to an evaluation unit. A flow control memory stores data indicating the sequence in which the clusters are to be evaluated. The evaluation units evaluate combinatorial blocks within a cluster in parallel. A cluster control memory indicates the manner in which a register is to be modified upon the evaluation (and results) of each cluster. The instructions in the flow control memory may be designed to examine the contents of the register and evaluate the clusters in different sequences depending on the content of the register. Evaluation of a loop of a non-cycle based design can thus be terminated based on the contents of the register.

19 Claims, 15 Drawing Sheets

FUNCTIONAL VERIFICATION OF BOTH CYCLE-BASED AND NON-CYCLE BASED DESIGNS

RELATED APPLICATIONS

The present application is related to the following commonly assigned U.S. patent applications, which are all incorporated in their entirety herewith:

(1) Application entitled, "Functional Verification of Integrated Circuit Designs", Ser. No. 09/097,874, filed: Jun. 15, 1998, now U.S. Pat. No. 6,138,266, and is incorporated in its entirety herewith;

(2) Co-pending application entitled, "An Improved Functional Verification System", Ser. No.; 09/738,260, Filed on even date herewith;

(3) Co-pending application entitled, "Tracing the Change of State of a Signal in a Functional Verification System", Ser. No.; 09/738,259, Filed on even date herewith;

(4) Co-pending application entitled, "Tracing Different States Reached by a Signal in a Functional Verification System", Ser. No.; 09/738,243, Filed on even date herewith; and (5) Co-pending application entitled, "Run-Time Controller in a Functional Verification System", Ser. No.; 09/738,272, Filed on even date herewith.

BACKGROUND OF THE INVENTION

1. Field of the Invention

The present invention relates to the electronic design of integrated circuits, and more specifically to a method and apparatus for the functional verification of a target integrated circuit design.

2. Related Art

Functional verification is one of the steps in the design of many integrated circuits. Functional verification generally refers to determining whether a design ("target design") representing an integrated circuit performs a function it is designed for. In a typical design process, a designer identifies the functions to be performed and designs a circuit using high-level languages (e.g., VHDL language well known in the relevant arts) to perform the identified functions. An example of a function may be to generate a predetermined output data corresponding to a given input data. Tools available in the industry are typically used to generate a lower-level design (e.g., at gate-level) from the design specified in a high-level language. The higher level languages are generally more understandable to a user (human-being) while the lower level languages are closer in representation to the physical implementation.

Usually, the lower level design is evaluated against input data to generate output data. A determination of the accuracy of a functional design may be made based on the output data. The manner in which input data is generated and output data is used for determination of accuracy may depend on the specific type of verification environment. For example, in an emulation environment, the target design receives input data in a "real environment" usually having other components, whose operation can be relied on for accuracy. The target design is implemented to typically operate at least with these other components. By testing the target design in combination with these other components, functional verification of the target design can be performed. In general, a functional verification system operating in an emulation environment needs to generate output data values quickly such that the output data is available in a timely manner for the other components.

In contrast, in a simulation environment, a designer specifies pre-determined input data and evaluates the target design against the input data. The output data generated by the evaluation is examined to determine whether the design performs the desired functions. Once a designer is satisfied with a design, the data representing the design is sent for fabrication as an integrated circuit.

Accuracy in the functional verification is an important requirement in the design process for several reasons. For example, it is relatively less expensive to alter a circuit design prior to fabrication compared to re-designing and sending the design data for fabrication. In addition, it may require several weeks of time to redesign and complete fabrication again. Such levels of delays may be unacceptable, particularly in the high- technology markets where short design cycles are generally important.

In addition to accuracy, the verification step needs to scale well to the functional verification of integrated circuits of large sizes. That is, a verification systems needs to provide for verification of integrated circuit designs of large sizes. As is well known, an integrated circuit (semi-conductor chip) can include transistors of the order of a few millions, and the number has been increasing over time.

Furthermore, it is generally desirable that the verification step be completed quickly or with minimal internal computations. The speed of verification is particularly important in view of the increase in size and complexity of integrated circuits. To decrease the total design cycle time, it is desirable that the functional verification be completed quickly.

Co-pending U.S. patent application entitled, "Functional Verification of Integrated Circuit Designs", Ser. No. 09/097, 874, Filed: Jun. 15, 1998, describes some functional verification systems in which a target design is partitioned into many combinatorial logic blocks connected by sequential elements (e.g., flip-flops) and with appropriate dependencies. The state tables corresponding to the logic blocks are evaluated and stored in multiple random access storage devices (RASDs).

The output corresponding to each input combination is stored such that the output is retrieved from the corresponding RASD when the input combination is provided as a memory address to the RASD. For example, assuming a four input combinatorial logic and a RASD having four bits address bus, if the output the combinatorial logic is to be a 1 corresponding to an input of 1011, a '1' is stored in the memory location corresponding to address 1011.

Cross-connects (XCONs) may interconnect the RASDs and enforce the dependencies which preserve the overall function of the target design. In general, the XCONs provide the outputs resulting from evaluation as memory addresses to RASDs. An XCON may be connected to multiple RASDs, and the XCON together with the connected RASDs may be referred to as a combinatorial logic output evaluator (CLOE).

In an approach described in the co-pending application noted above, each CLOE is connected to 16 other CLOEs (termed as neighbors). One of these CLOEs acts as a central CLOE to communicate with other groups of 16 CLOEs. In other words, if the output of a combinatorial logic evaluated in a first group and the output is to be provided as an input to a RASD in another group, the central CLOEs of the two groups may need to communicate to enable the necessary data transfer.

Such an approach may have several disadvantages. For example, the scheduling of evaluation of a combinatorial block may be undesirably complicated as the inputs may need to be communicated from several CLOEs and due to the 'hierarchy' in communication resulting from the central CLOE. Accordingly, the embodiments of the co-pending application may not be suitable in some environments.

Therefore, what is needed is a method and apparatus which enables the CLOE outputs to be communicated in an efficient manner such that the evaluations can be scheduled and performed quickly. In addition, the approach generally needs to allows for one or more of several related features such as tracing, verification of cycle based and non-cycle based designs, etc.

SUMMARY OF THE INVENTION

The present invention enables the functional verification of both cycle-based and non-cycle based designs. In an embodiment, evaluation units are designed to evaluate one of several combinatorial blocks within a cluster in response to receiving a cluster number identifying the corresponding cluster. The combinatorial blocks together specify a target design including data dependencies. A flow control memory stores flow control instructions indicating the sequence in which the clusters are to be evaluated. A flow processor sends a sequence of cluster numbers to the evaluation units to cause the target design to be evaluated.

To facilitate the evaluation of non-cycle based designs which contain loops, a register is used to store data indicating a condition under which the evaluation of a loop is to be terminated. A cluster control memory stores data indicating the manner in which the register is to be modified upon evaluation of the clusters. The flow control memory may store data indicating a sequence in which the cluster numbers are to be sent depending on different values in the register. As a result, loops of non-cycle based designs may be implemented in accordance with the present invention.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

I. Overview and Discussion of the Invention

The present invention provides an efficient communication mechanism between combinatorial logic output evaluation units (CLOEs) evaluating combinatorial blocks, with the combinatorial blocks together typically representing a target design sought to be verified. A run time control unit may be provided which interconnects several CLOEs. The run-time controller may be designed such that any output of a CLOE required for a later use (as a part of a memory address) by another CLOE is provided to the another CLOE using a bus.

In an embodiment described below, a bus may be conveniently designed to carry all the outputs required for later use by any of the CLOEs and each CLOE may be designed to store the required outputs internally and use the stored data at an appropriate later time, potentially after several cycles.

Due to the easier availability of the output data generated by other CLOEs, the logical partitioning of a target design may be greatly simplified. In addition, any bottlenecks otherwise created due to the timely unavailability of the data, may also be avoided.

The present invention is described below in further detail with reference to several examples. First, the hardware architecture in accordance with the present invention is described in section I. The manner in which The method of the present invention is described first. Example environments and systems in which the present invention can be implemented are described later.

II. General Architecture
II. 1. Method of the Present Invention

Figure 1:
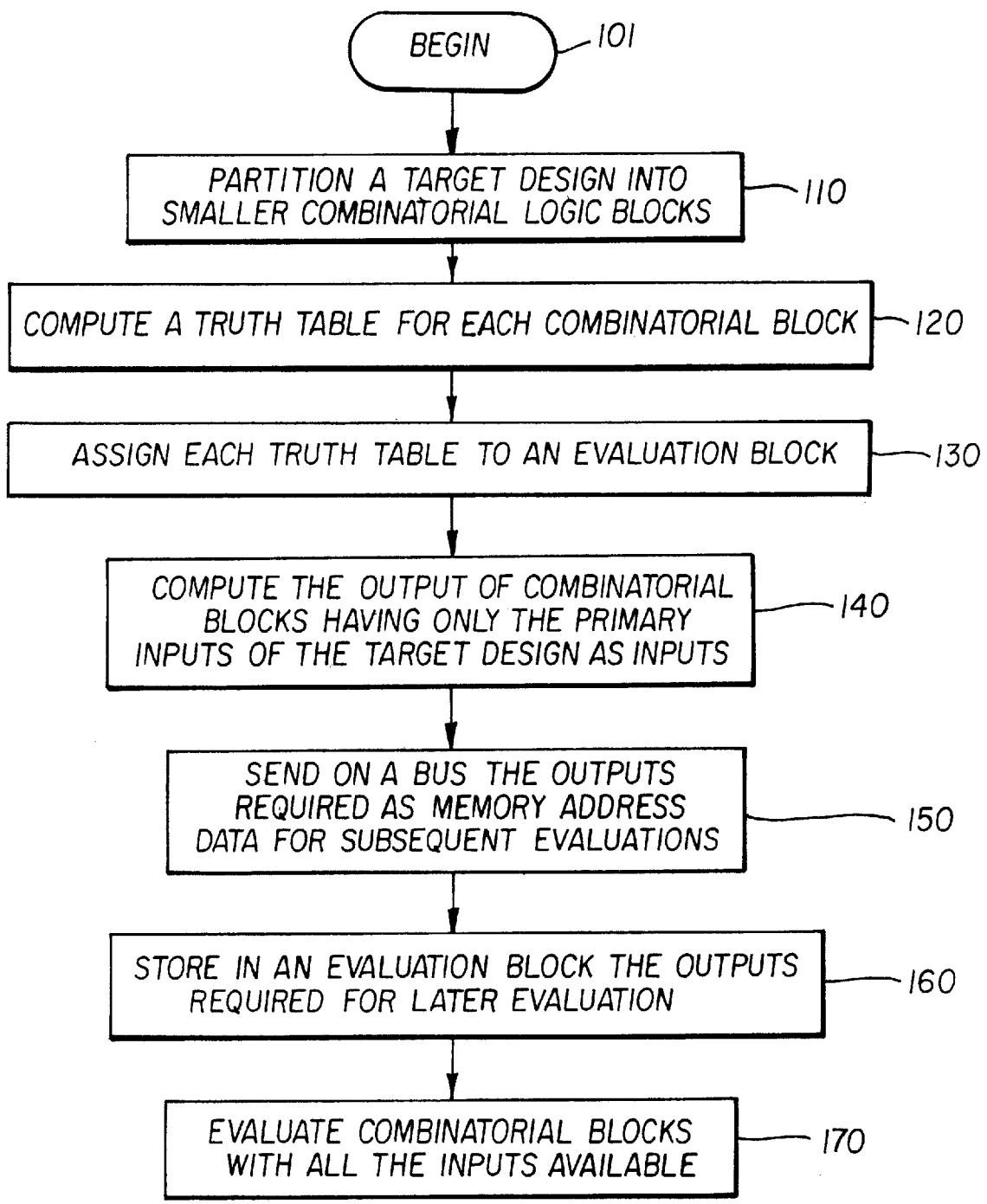
FIG. 1 is a flow-chart illustrating a method in accordance with the present invention.

FIG. 1 is a flow-chart illustrating a method in accordance with the present invention. The method begins in step 101, in which control passes to step 110. In step 110, a target design is partitioned in smaller combinatorial blocks while preserving the logical dependencies. The partitioning can be performed in one of several ways. The target design can represent either a cycle-based design or a non-cycle based design.

In step 120, a truth table is computed for each of the combinatorial blocks. Each truth table has several entries (rows), with each row identifying one combination of input values and corresponding output value. The truth tables can be computed in a known way.

In step 130, each truth table is assigned to an evaluation block. An evaluation block may contain or be associated with a memory ('local memory') for storing the assigned truth tables. The output of each truth table may be stored in a memory location having a memory address formed by the corresponding combination of input values. As a result, a combinatorial block may be evaluated in a single memory access. It may be noted that a memory location may contain multiple bits, and thus a corresponding number of combinatorial blocks may potentially be evaluated in a single memory access.

In step 140, the combinatorial blocks requiring only the primary inputs (i.e., those provided as inputs to the target design) of a target design may be evaluated by the corresponding evaluation blocks to generate the corresponding outputs. Typically, each output may be evaluated in a single memory access.

In step 150, the outputs of the evaluated combinatorial blocks required as inputs to several evaluation blocks which evaluate additional combinatorial blocks are sent on a bus. A bus generally refers to a communication path on which the same data can be accessed by (or sent to) multiple recipients (here the evaluation blocks). The bus can be implemented using any technology (e.g., using a physical medium or wireless).

In step 160, each output required for later evaluation may be stored locally in evaluation blocks which require the corresponding output. Some of the outputs may be used for multiple evaluations during different evaluations. In such a case, a single copy of the output may be used multiple times or multiple copies may be maintained, one for each evaluation.

In step 170, additional combinatorial blocks with inputs available may be evaluated. Control is then transferred to step 150, in which the outputs of the evaluated blocks are made available for subsequent evaluations. Steps 150, 160 and 170 are repeated until the functional verification is complete (not shown in FIG. 1).

Thus, using a method in accordance with FIG. 1, functional verification of a target design can be performed in accordance with the present invention. Several embodiments can be implemented using the method. Some example embodiments implementing some of the features of the method are described below for illustration.

II. 2. Verification System

Figure 2A:
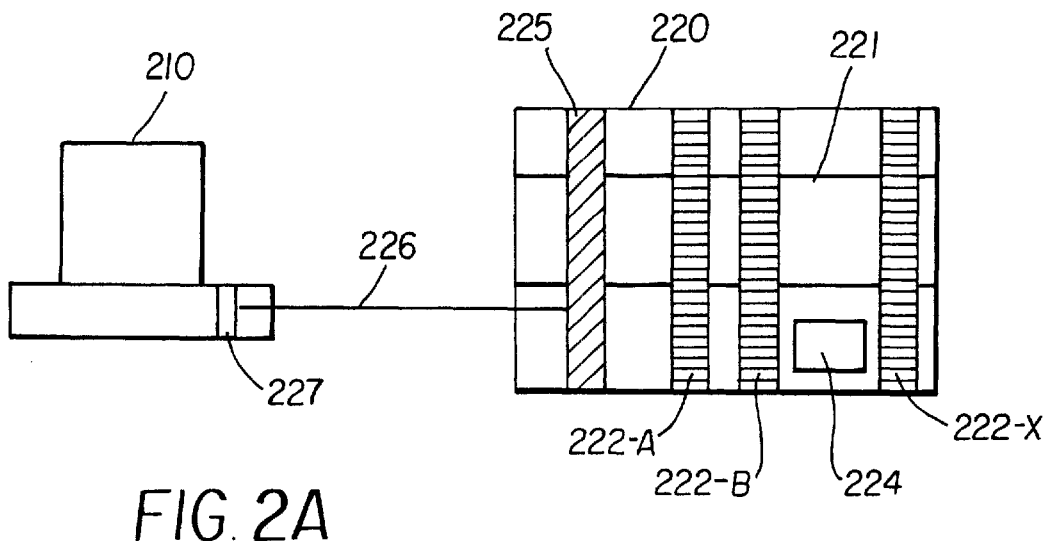
FIG. 2A is a block diagram illustrating an environment in which the present invention can be used.
Figure 2B:
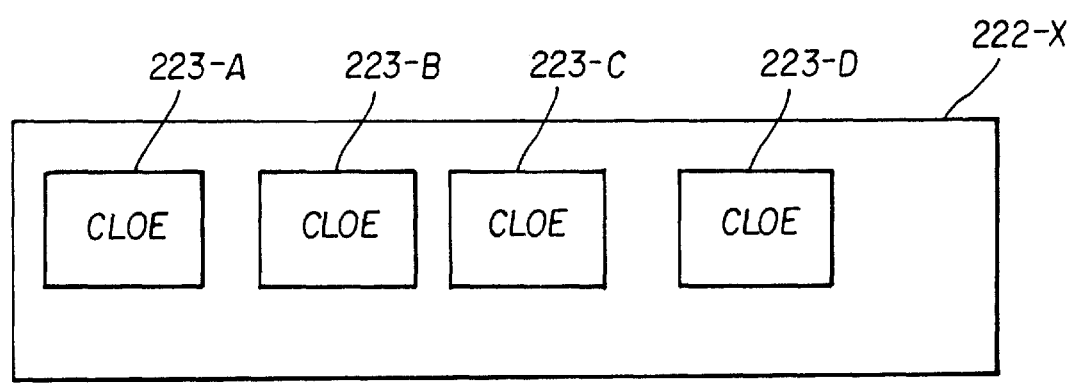
FIG. 2B is a block diagram depicting the potential presence of multiple combinatorial logic output evaluators (CLOEs) in each verification board contained in a verification system of FIG. 2A.

An example embodiment of verification system 200 in accordance with the present invention is depicted in FIG. 2. For illustration, verification system 200 is shown in a simulation environment. However, the present invention can be implemented in other types of environments such as emulation environments. Verification system 200 may include combinatorial logic output generator (CLOG) 210, and verification chassis 220.

CLOG 210 receives data representing a target design and partitions the target design into multiple combinatorial logic blocks. The target design can be any type of design including cycle-based designs and non-cycle based designs. The partitioning may be performed in one of several ways. Example approaches of partitioning are described in co-pending U.S. patent application entitled, "Functional Verification of Integrated Circuit Designs", Ser. No. 09/097,874, Filed: Jun. 15, 1998, and is incorporated in its entirety herewith.

CLOG 210 may configure verification system 220 according to the partitioned target design. The below provided description of verification system 220 provides guidance on the manner in which the configuration may need to be performed. Chassis interconnect unit 227 contained in CLOG 210 may provide the necessary communication with verification chassis 220 on interconnect provisioning link 226. Interconnection provisioning link 226 may be implemented using any technologies such as local area networks.

Verification chassis 220 may be configured according to the partitioning performed by CLOG 210. Verification chassis 220 may then perform functional verification in accordance with the present invention. During the verification process, verification chassis 220 generates output data (primary or internal) corresponding to each state change in the target design. A state change may be caused either due to the logic implemented within a target design or due to changes in input data.

The computation of the outputs corresponding to each change of state of the target design is generally referred to as a verification cycle. A verification cycle typically consists of a specified number of machine cycles, dependent on the target design and the mapping into internally into different memory units. A stage of a combinatorial logic can be evaluated in each machine cycle as an evaluation typically requires a single memory access. An example implementation of verification chassis 220 is described below.

II. 3. Verification Chassis 220

Continuing with reference to FIG. 2, parts of an embodiment of verification chassis 220 can be implemented by modifying one of many commercially available Compact-PCI chassis in the market place. Verification chassis 220 may include one or more boards (shown as 222-A through 222-X), back-plane system 221, run time control unit (RTC) 225 and power and cooling system 224.

Power and cooling system 224 provides the electrical power to the remaining components and maintains the temperature of all the components within any desired temperature in a known way. Verification boards 222-A through 222-X are described with general reference to 222-X.

Verification chassis 220 may contain multiple slots, with each verification board occupying a slot. Each verification board 222-X may contain multiple evaluation blocks in the form of combination logic output evaluation (CLOE) blocks shown as 223-A through 223-P in FIG. 2B. Each CLOE may operate as a verification unit of one or more combinatorial logic blocks generated by partitioning a target design.

Backplane 221 may provide the necessary connection between CLOEs on different verification boards (222-A through 222-Z) through run time control unit 225. The connections are used for inter-CLOE communication to implement various dependencies in the evaluation of a target design. The connections are also used to facilitate run time control unit (RTC) 225 to control the sequence of evaluations in the CLOEs. Backplane 221 typically provides a certain number of connectors for each verification board, and these connectors are used for inter-CLOE communication across multiple boards and for controlling the sequence of evaluations.

The intra-board, inter-board communications will be clearer based on an understanding of each CLOE. Accordingly, an embodiment of CLOE 223-A is described below.

II. 4. Combination Logic Output Evaluation Block (CLOE) 223-A

CLOE 223-A evaluates a part of the combinatorial logic (in the form of one or more blocks) in a target design. To perform this evaluation function, CLOE 223-A may require one or more signals from one of two sources. Output(s) of any other CLOE in the system, from any of the previous machine cycle, is one of the sources. The second is any of the primary inputs. Once the inputs are available, the blocks can be evaluated in a known way.

Figure 3:
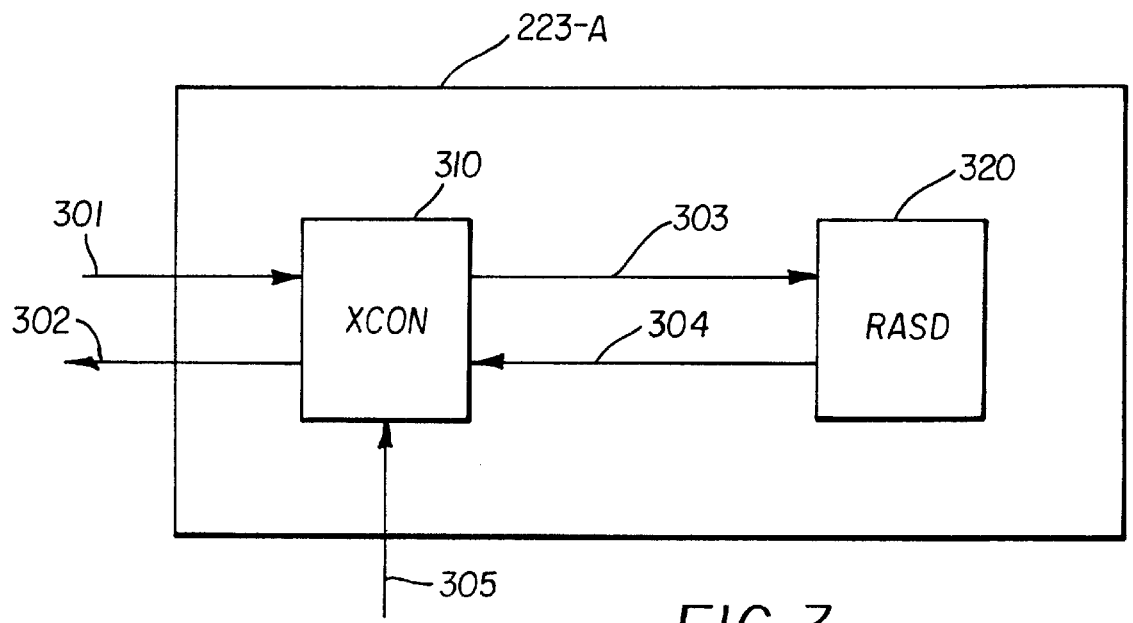
FIG. 3 is a block diagram of an embodiment of a CLOE containing a cross connect (XCON) and a random access storage device (RASD)

FIG. 3 is a block diagram of CLOE 223-A illustrating an embodiment for implementing the above-noted scheme. CLOE 223-A includes cross-connect controller (XCON) 310 and random access storage device (RASD) 320. RASD 320 stores the truth tables corresponding to various blocks to be evaluated by CLOE 223-A. XCON 310 sends a memory address on path 603 and receives the evaluated outputs.

XCON 310 provides for communication with the remaining CLOEs in verification system 200. Bus 301 provides the outputs of many CLOEs. This bus is a collection of outputs from many CLOEs in the system and may be driven by RTC 225. Path 302 may be used to provide the collection of outputs from CLOE 223-A to other CLOEs in verification chassis 220. Bus 305 transfers a cluster number provided by RTC 225 to all the CLOEs in the system. In general, a cluster number identifies a group of combinatorial blocks generated by the partition, and the blocks identified by the cluster number may be evaluated in the same machine cycle.

The manner in which communication can be facilitated between different CLOEs is described first. Example implementations of XCON controller 310 and RASD 320 are described next. The manner in which truth tables can be stored in RASD 320 for efficient retrieval is described then. The details of RASD 320 and XCON controller 310 in several example embodiments will be clear from these descriptions.

II. 5. Interconnecting CLOEs and RTC

Figure 4:
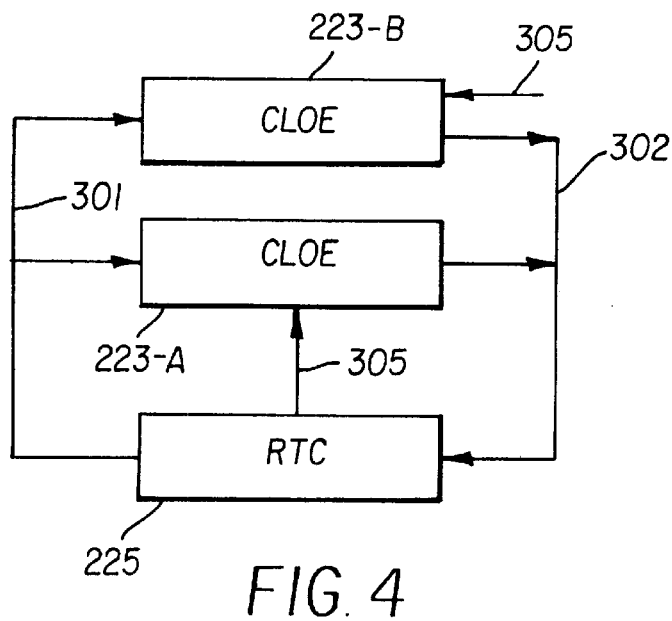
FIG. 4 is a block diagram a verification system illustrating the manner in which a run time controller may provide evaluation outputs to multiple CLOEs using a bus.

FIG. 4 is a block diagram illustrating the logical interconnection between the CLOEs and the run time control (RTC) 225 in one embodiment. The evaluation outputs from all the CLOEs may form path 302 that is connected to the RTC 225. RTC 225 makes the outputs available to many CLOEs on bus 301. For the purpose of the description of the present invention, it may be assumed that RTC 225 merely forwards the evaluated outputs on bus 301.

Path 305 may be used to specify a cluster number to be evaluated by the CLOEs. In addition, RTC 225 may send a cluster valid signal on path 305 to each CLOE indicating whether the corresponding CLOE is assigned any combinatorial blocks contained in the specified cluster. The description is continued with reference to an example embodiment of CLOE 223-A. As will be apparent from the description, CLOE 223-A may store locally any evaluation outputs required in future cycles. The implementation of CLOG 210 may be simplified as a result.

II. 6. Cross-Connect (XCON) 310

As may be apparent from the above description, XCON 310 is the component responsible for controlling the actual evaluation in the verification system during a verification cycle. XCON 310 may be implemented to perform two actions: (1) to control a specified number of RASD 320 devices by providing address, select and control signals to the appropriate RASD during the appropriate machine cycle, and (2) to provide a mechanism to connect the data outputs from the controlled RASD units to other XCONs via RTC 225 while maintaining data dependencies.

At least to provide the appropriate address to RASD 320 (as in act 1 noted above), XCON 310 may contain an internal memory to store the evaluation outputs generated during a previous machine cycle. The internal memory may be implemented as several random access memories as described below with reference to an example embodiment.

Each RASD 320 can store the output values of multiple truth tables. In accordance with an aspect of the present invention, the output values may be stored in storage locations having an address formed based on the input data values. As the availability of the input data values is generally a pre-condition to evaluation of any block, the address for accessing a storage location can be computed immediately upon the availability of the input data values. As will also be apparent to one skilled in the relevant arts, the address bits can potentially be used immediately upon being generated as output of combinatorial blocks.

Figure 5:
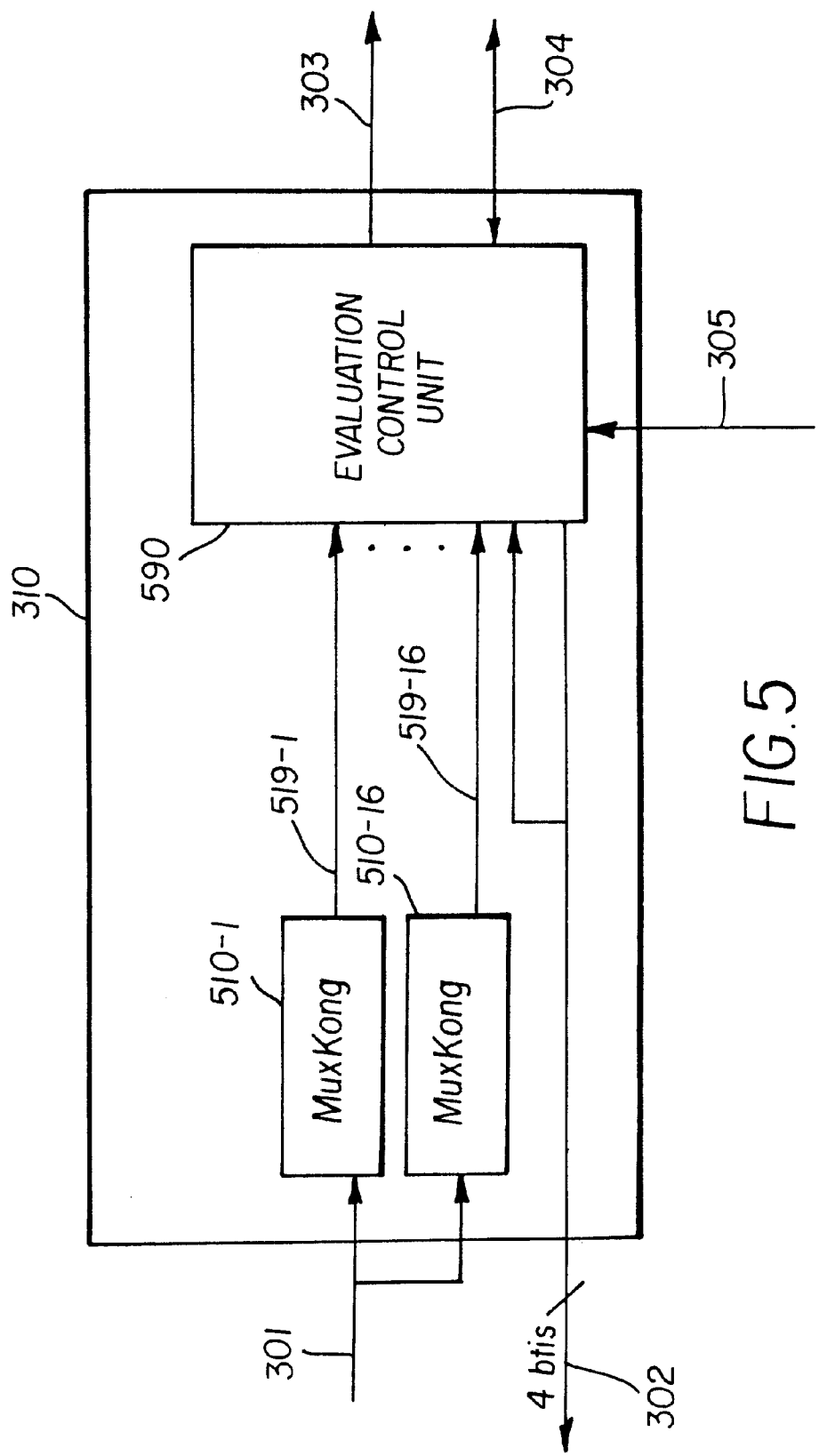
FIG. 5 is a block diagram of an embodiment of an XCON which selects and stores evaluation outputs and uses the stored data for later evaluations.

FIG. 5 is a block diagram illustrating an example implementation of XCON 310. XCON 310 may contain muxkongs 510-1 through 510-16 and evaluation control unit (ECU) 590. Each of the muxkongs will be generally referred to by numeral 510. Similar convention is followed with respect to other elements/blocks in the present application. The operation of the components depicted in FIG. 5 is described below in further detail. In general, the operation is controlled by the configuration performed by CLOG 510.

Each muxkong may generate one bit of the 16-bit address sent to evaluation control unit 590. Muxkong 510 may be designed to perform the following acts:
 (1) select and store the bits received on bus 301 driven by the RTC every machine cycle; and
 (2) select the signals out of the above mentioned stored bits to be used as evaluation inputs 519-1 to 519-16, every machine cycle.

Evaluation control unit (ECU) 590 may be designed to perform the following acts:
 (1) generate the appropriate address for the RASD unit 320 using the evaluation inputs 519-1 to 519-16, and cluster number 305 received from the RTC; and
 (2) generate the current evaluation outputs on path 302 for the previous read operation.

The manner in which the above acts can be accomplished in example embodiments is described below in further detail.

II. 7. Muxkong 510

Figure 6:
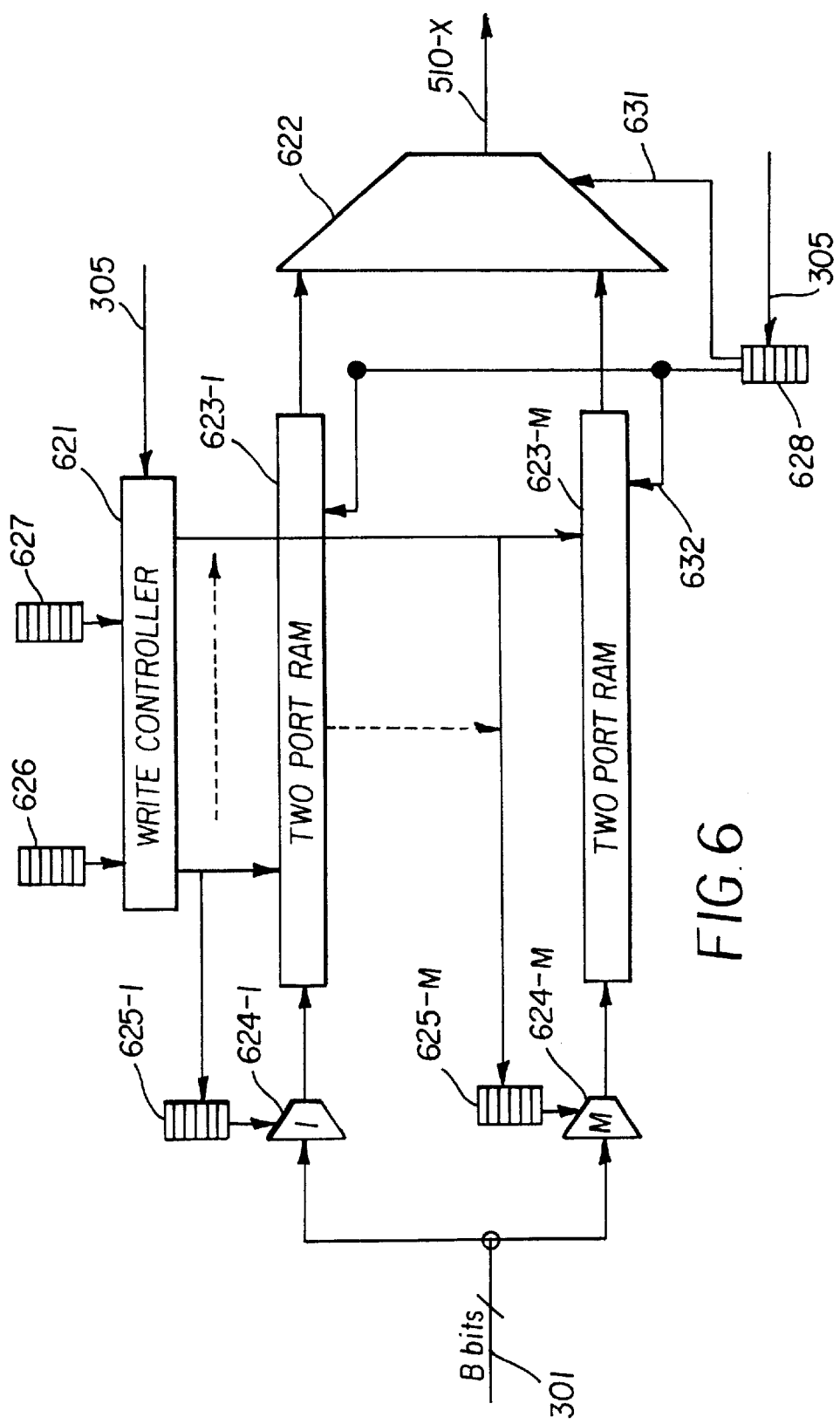
FIG. 6 is a block diagram of an embodiment of a muxkong (contained in an XCON) illustrating the manner in which several bits of evaluation outputs can be selected and stored, and later used for evaluation of more combinatorial blocks.

FIG. 6 is a block diagram illustrating the details of muxkong 510-1 in one embodiment. Muxkong 510-1 may contain multiplexors 624-1 through 624-M, random access memories (RAMs) 623-1 through 623-M, write controller 621, read controller 628 and multiplexor 622. First a broad overview of the components is provided, and then the components are described in detail.

Broadly, CLOG 210 determines a priori which bit of bus 301 relates to which specific combinatorial block generated by the partition. If a bit is required as an input for a future evaluation and if that is to be provided as a part of the address by muxkong 510-1, CLOG 210 causes one of the multiplexors 624 to select the bit and store the bit in the related RAM 623. CLOG 210 may also control the specific address in the RAM at which the selected bit is stored. In many cases, more than one bit may be needed by muxkong 510-1, and a corresponding number of multiplexors 624 may be configured to select the desired bits. In general, write controller 621 causes the data to be selected and stored in the appropriate locations.

Once the bits are stored, read controller 628 may cause the appropriate bit to be generated on output 510-X by ensuring the appropriate bits are read from RAMs 623-1 through 623-M, and by controlling multiplexor 622 to select the appropriate bit. The bits selected by all the muxkongs in a CLOE are used by the evaluation control unit 511 in generating the address for a RASD.

In one embodiment, muxkong 515 may select and store "M" bits out of the "B" bits provided on bus 301, in parallel from the RTC. For purposes of illustration of the operation of the embodiment, it will be assumed that B=128 and M=8 such that 8 of the 128 bits may be potentially selected and stored. Verification system 220 may be designed to support a maximum of C (equal to 16,000 in an embodiment, and $Log_2C=14$) clusters. As noted above, each cluster contains a set of combinatorial blocks, and a combinatorial block may potentially be included in more than one cluster for scheduling efficiency.

Each RAM 623 may be implemented as a dual-port RAM to support one evaluation in each machine cycle. Each RAM 623 may contain $2^{11}$ (approximately 2000 or referred to as 2K) locations, with each location containing a bit. Thus, all the eight (M) RAMs together may contain 16K locations. Successive memory addresses may be logically viewed as being in successive RAMs, for example, address 0 may be in RAM 623-1 and address 1 may be in RAM 623-2.

With respect to write operation, write controller 621 receives a cluster number on path 305. Write controller 621 uses the cluster number as an index into write start stack 626 and write count stack 627, which may both be configured (or set) by CLOG 210 based on the partitioning of a target design and allocation of different combinatorial blocks.

Write start stack 626 generates a start address and write count stack 627 indicates the number of bits (received on bus 301) to be stored in RAMs 623-1 and 623-M together. As noted above, each address is uniquely associated with each RAM and thus, a number of RAMs starting with the RAM at the generated start address are written into. Thus, assuming a count stack generates a count of 3 and write start stack 626 generates an address located in RAM 623-3, data may be written into RAMs 623-3, 623-4 and 625-5. Write controller 621 may cause only the corresponding RAMS to be written into for the present machine cycle. The contents of other RAMs may be left unaltered.

Write controller 621 may control the multiplexors corresponding to the RAMs by interfacing with stacks 625 to cause each multiplexor to select the desired bits. Each of the stacks 625-1 through 625-M may contain a number of locations equal to the number of bits (or C/M in general) in the related RAM. Thus, in the present example, each stack 625 may contain 2K locations.

The locations of stack 625 are configured (by CLOG 210) to control the specific bit selected by the corresponding multiplexor 624. The write address generated by accessing write start stack 626 may be used as an index (or address) to stack 625, to retrieve the content of the corresponding location. As each cluster number received on path 605 may uniquely identify a start address and as each address uniquely identifies a location in stack 625, the content of the identified location in each stack 625 may specify a desired bit.

As may be readily appreciated, each location of stack 625 may contain $log_2B$ number of bits. Different stacks contain different values to reflect the corresponding bit to be selected. An example illustrates the write operation in further detail.

Assuming that for cluster number of 200, a memory start address of 402 and a count of 2 is generated, bits may need to be written at a RAM address of 51 of RAMS 623-3 and 623-4. Thus, address 51 is provided as address to RAMs 623-3 and 623-4, and to corresponding input stacks 625-3 and 625-4. Assuming, bit 64 (on bus 301) is to be stored by RAM 623-3 and bit 5 is to be stored in RAM 623-4, location 51 of stacks 625-3 and 625-4 may respectively contain 64 and 5.

Thus, when cluster number of 200 is received on bus 605, inputs of 64 and 5 are provided on multiplexor select lines of multiplexors 624-3 and 624-4 respectively. As a result, multiplexors 623-4 and 624-4 respectively select bits 64 and 5. The selected bits are stored in location with a RAM address of 51 in RAMs 623-3 and 623-4 respectively.

It should be understood that CLOG 210 may need to configure the stacks 625, 626, 627 and 628 with appropriate data based on the partitioning of a target design into appropriate combinatorial blocks. Once the partitioning and configuration of verification system 220 is complete, the verification may occur in a short duration of time as several combinatorial blocks can be evaluated in a single machine cycle.

With respect to read operation, read controller 628 provides the address from which the data is read out of the RAM blocks 623-1 through 623-M. The read controller may be implemented as a RAM that has 'C' locations, each of which is $log_2C$ bits wide. Of the $log_2C$ bits that are read during every valid cluster cycle, $log_2M$ bits are used as select lines 631 for the multiplexor 622. The remaining bits ($log_2C-log_2M$) are used as read address lines 632 for the RAMs 623-1 through 623-p. RAMs 623-1 through 623-M may receive the same read address line bits. In general, data identifying an address at which the is to be stored/retrieved from RAM 623 will be referred to as a storage index, and data identifying the specific bit to be selected (and provided as an input to multiplexors 624 and 631) will be referred to as a selecting index.

Read controller uses the cluster number received on path 605 to determine which location it should index into in the read address stack implemented as a RAM. Again, CLOG 210 may configure the content of read controller 628 (in all CLOEs in verification system 220) to ensure that the input data required for evaluating each combinatorial block within the specified cluster is retrieved the RAMs.

Multiplexor 622 selects the one bit stored for the specified cluster stored in muxkong 515-1. Evaluation control unit 590 receives 16 such inputs and accesses the data in a RASD to evaluate a combinatorial block. An embodiment of evaluation control unit 590 is described below in further detail.

II. 8. Evaluation Control Unit 590

Figure 7:
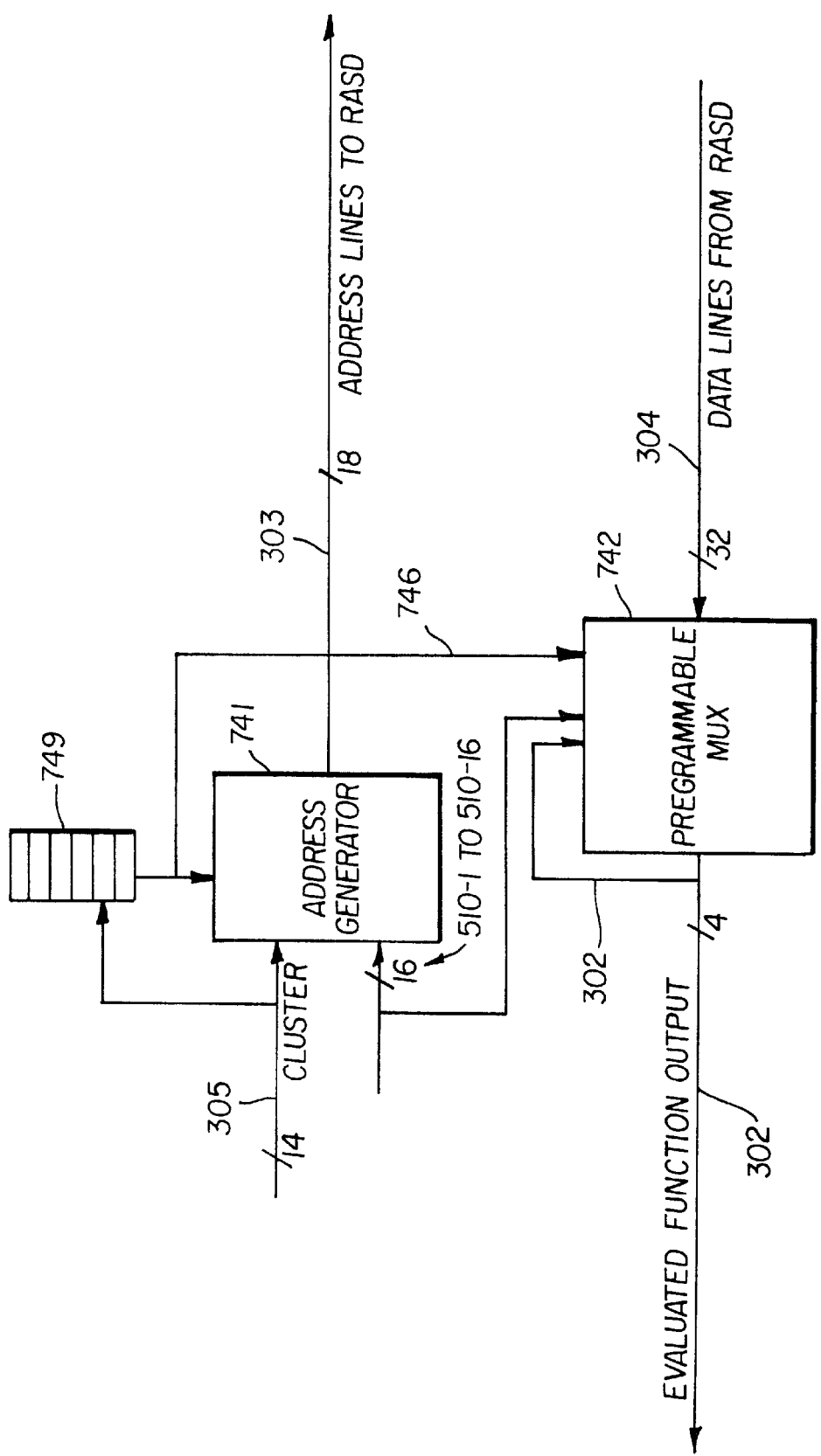
FIG. 7 is a block diagram of an embodiment of evaluation control unit which interfaces with several muxkongs to generate an address for RASD, and provides the evaluation outputs to the evaluation control unit.

FIG. 7 is a block diagram illustrating the design and operation of evaluation control block 590 in one embodiment. Evaluation control unit 590 may contain address generator 741 and programmable multiplexor 742. The components are described below in further detail.

Address generator block 741 may receive 14 bits (corresponding to 16K clusters) of cluster number information on path 305 from RTC 225 along with the 16-bits of input from muxkong blocks 510-1 through 510-16, and generate a 18-bit address for RASD 320. Only a subset of the 16 bits received from muxkongs may be used in generating the 18-bit address. The remaining of the 16 bits are used by programmable multiplexor 742 as described below. In addition to the bits selected from the 16-bits received from the muxkongs, the rest of the 18-bit address contains bits from the cluster number.

Stack 749 controls the manner in which the bits from muxkongs and cluster identifier are combined to form the 18 bit address. Stack 749 may contain the same number of locations as the number of clusters supported, and CLOG 210 may store the data identifying how the 18-bit address is to be generated for each cluster evaluated by evaluation control unit 590. Stack 746 may also be configured to control the specific bits from RASD output 304, which are selected and sent to other CLOEs. As noted above, a maximum of 4 bits may be sent from each CLOE to RTC 225. The contents of stack 749 can be better appreciated by understanding the operation and implementation of programmable multiplexor 742.

Programmable multiplexor 742 may receive a 32-bit word stored at an address specified by address lines 303, and select up to four bits as specified by path 746. The four bits are provided to RTC 225, which in turn sends the bits to several CLOEs for use in subsequent evaluations. Feedback path 302 makes available the evaluation outputs available in the immediate clock cycle for an evaluation in the immediate clock cycles. Without feedback path 302, the evaluation outputs may not be available for additional evaluations immediately due to the pipeline delays as data may need to be transferred through RTC 225 and XCON. An embodiment of programmable multiplexor 742 is described in further detail below.

II. 9. Programmable Multiplexor

Figure 8:
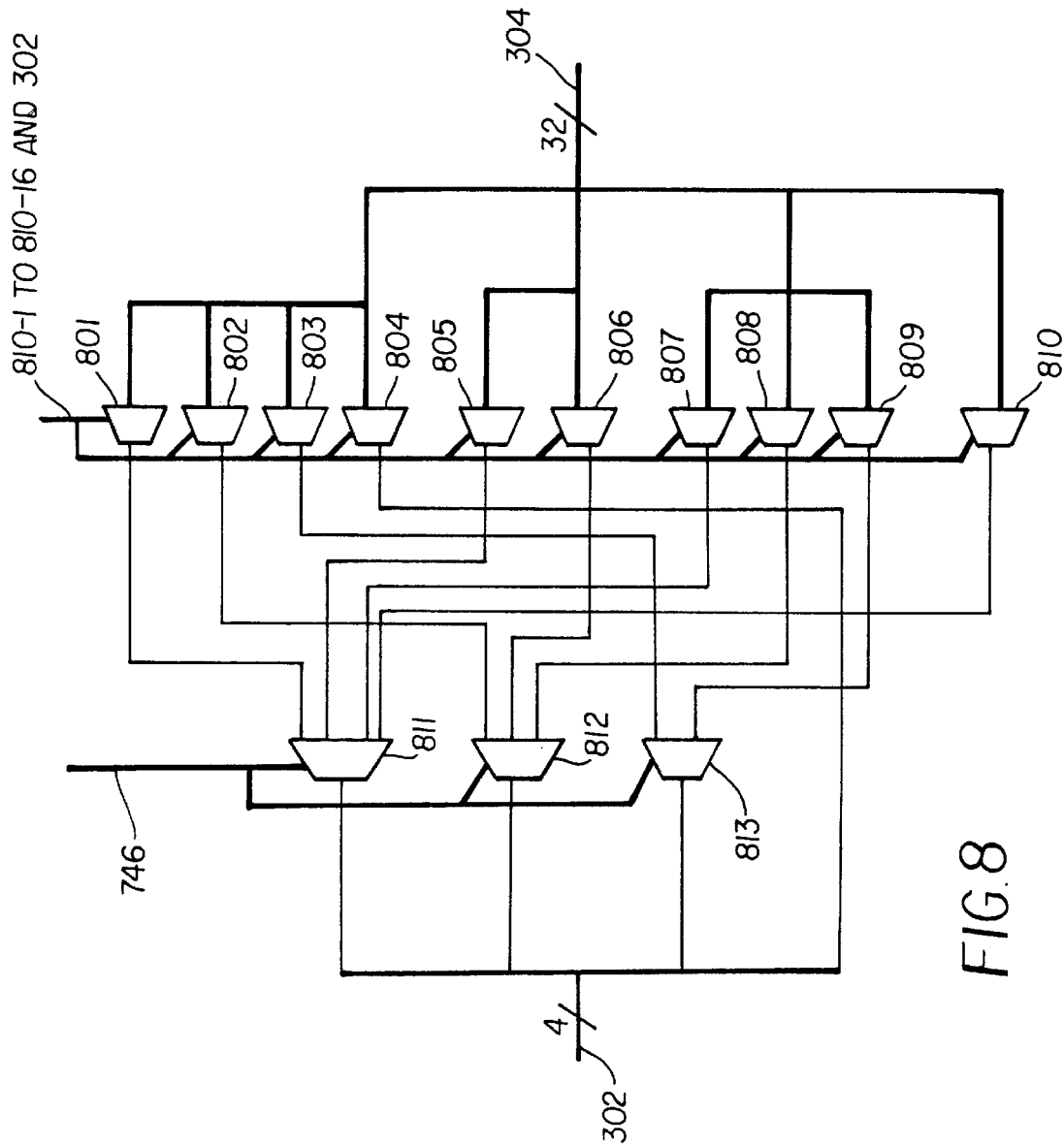
FIG. 8 is a block diagram of an embodiment of a programmable multiplexor (contained in evaluation control unit) illustrating the manner in which only a sub-set of the bits retrieved from a RASD can be designed to represent the actual evaluation outputs.

FIG. 8 is a block diagram of an programmable multiplexor 842 illustrating an example implementation thereof. Programmable multiplexor 842 may contain multiplexors 801–813. The operation of each multiplexor 801–813 depends on the number of outputs sought to be selected from the 32 bit data received on path 604 from RASD.

Broadly, path 746 indicates the number of outputs presently being evaluated. When four outputs are evaluated, multiplexors 811–813 provide an output bit each, and the fourth output is generated directly by multiplexor 804. When three combinatorial blocks are evaluated, multiplexors 811–813 provide an output bit each. When two combinatorial blocks are evaluated, multiplexors 811 and 812 provide an output bit each. When a single combinatorial block is being evaluated, multiplexor 811 provides the single output bit. The specific bit to be selected by each of the multiplexors is determined by the data received on path 746 (as configured by CLOG 210 according to the partitioning and dependencies) as described in further detail below.

Multiplexor 811 receives as inputs the outputs of multiplexors 801, 805, 807, and 810, and generates an output bit in case selection of 1, 2, 3, or 4 output bits from the 32 bits of data. Multiplexor 812 receives as inputs the outputs of multiplexors 802, 806, and 808, and generates an output bit in the case of selection of 1, 2, or 3 output bits from the 32 bits of data. Multiplexor 813 receives as inputs the outputs of multiplexors 803 and 809, and generates an output bit in the case of selection of 1 or 2 output bits from the 32 bits of data. The output of multiplexor 804 generates the fourth bit of data when four bits are selected from the 32 bits of data. Again, the data received on path 746 determines the specific bits selected by each of the multiplexors 811–813 and the number of valid outputs (1–4).

Each of the multiplexors 801–810 receive as inputs some of the bits 1–32 as inputs, and selects one of the bits under the control of some of the bits 510-1 through 510-16. The specific inputs and selection control signals are described below with reference to Table 1. The entries are described with reference to the row corresponding to multiplexor 802. Multiplexor 802 receives 3 bits (304-4 through 304-6) as inputs and selects one of the bits as determined by select lines 510-3 through 510-4. Multiplexor 802 participates in the cases when 2, 3 or 4 bits are selected (but not when only 1 bit is selected) from the 16 bits of input. Thus, with the above-described implementation, CLOG 210 may determine in which bit positions of RASD to store the output of an evaluation based on the desired parallelism, and configure the stacks accordingly to accomplish the parallelism.

TABLE 1

| Multiplexor | Input bits (304) | Select lines (510) | Context Used in |
|---|---|---|---|
| 801 | 1–8 | 1–3 | Used in all cases(1, 2, 3, or 4 bits being selected) |
| 802 | 9–16 | 4–6 | 2, 3, or 4 bits selected |
| 803 | 17–24 | 7–9 | 3 or 4 bits selected |
| 804 | 25–32 | 10–12 | 4 bits selected |
| 805 | 1–16 | 1–4 | Used in all four cases |
| 806 | 17–32 | 5–8 | 2, 3, or 4 bits selected |
| 807 | 1–8 | 1–3 | Used in all four cases |
| 808 | 9–16 | 4–6 | 2, 3, or 4 bits selected |
| 809 | 17–32 | 7–10 | 3 or 4 bits selected |
| 810 | 1–32 | 1–5 | Used in all four cases |

Thus, if three combinatorial blocks within a cluster are to be evaluated in parallel, the corresponding three outputs may be stored, for example, in bits 7, 11, and 31. CLOG 210 may then cause multiplexors 807, 808, and 809 to select the 7th, 3rd, and 15th inputs respectively. CLOG 210 may then cause multiplexors 811, 812, and 813 to select inputs 3, 3 and 2 respectively such that bits 7, 11 and 31 of the retrieved 32 bits are provided on path 302.

The purpose of feedback path 302 (shown in FIG. 7) is described now. Some times, it is desirable that the evaluated outputs be used immediately as inputs for additional evaluations within the same CLOE. Sending the output data through RTC 225 and receiving the same data generally introduces pipeline delays, and the additional evaluations may need to be postponed. The resulting delay in evaluations may be undesirable at least in some circumstances.

Accordingly, the evaluated outputs may be immediately provided to multiplexors 801–810. Additional multiplexors (not shown) may be used to provide these evaluated outputs (instead of the bits generated by XCONs). Such implementation will be apparent to one skilled in the relevant arts based on the disclosure herein.

Using suitable partitioning and storage techniques, up to four combinatorial blocks can be evaluated in parallel in each CLOE. In one embodiment, verification system 220 may contain 32 CLOEs, and each CLOE can generate up to four output bits each machine cycle. The resulting 128 bits may be provided to all the thirty-two CLOEs.

However, the sixteen CLOEs may be insufficient to perform functional verification of integrated circuit designs containing a large number of gates. Accordingly, an aspect of the present invention enables multiple CLOE groups to be implemented to scale to complex environments as described below with reference to FIG. 9.

II. 10. Multiple CLOE Groups

Figure 9:
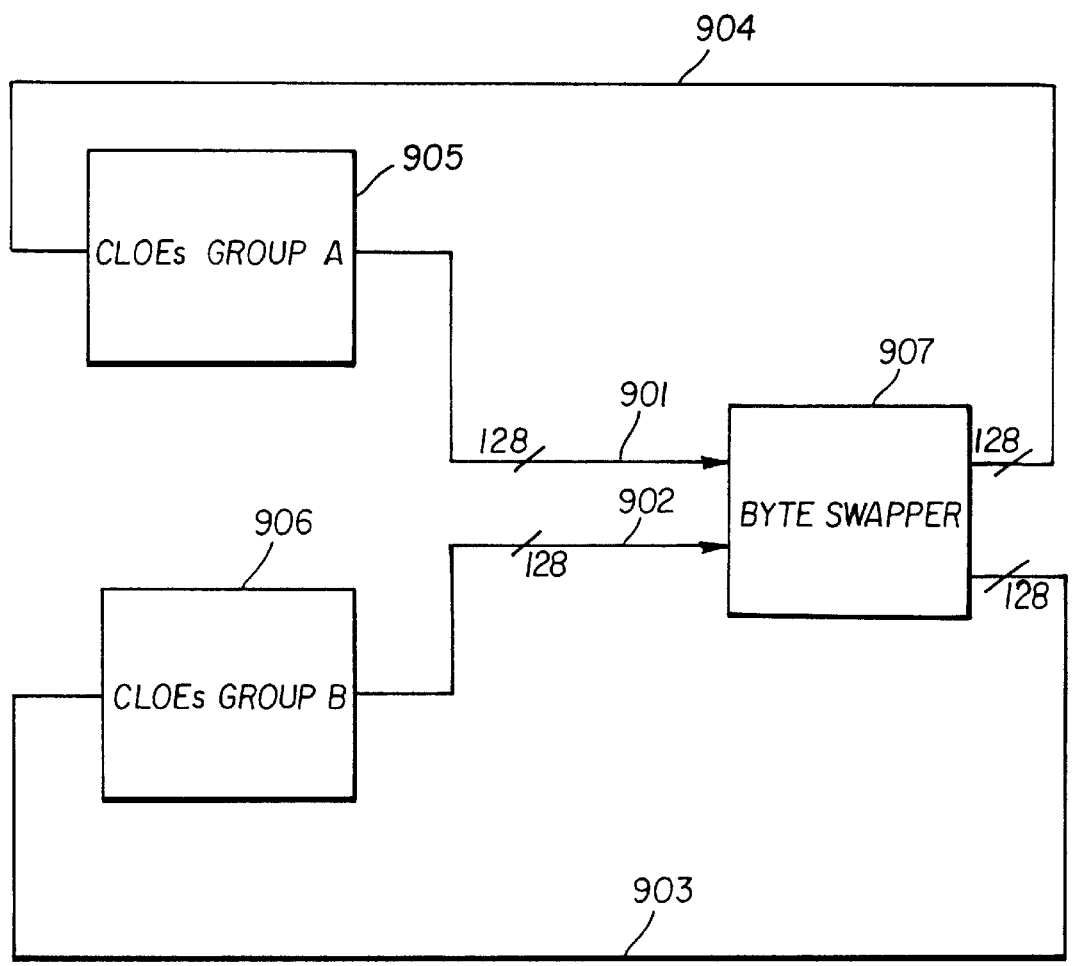
FIG. 9 is a block diagram illustrating the manner in which a byte swapper can be implemented to transfer evaluation outputs from one group of CLOEs to another group.

FIG. 9 is a block diagram illustrating the manner in which the a verification system in accordance with the present invention can be extended to operate with integrated circuits containing a large number of gates. The CLOEs in the verification system may be logically divided into multiple groups, for example, into group A 905 and group B 906. Each group may receive 128 output bits each clock cycle.

Byte swapper 907 may be contained within RTC 250, and enables bits generated by CLOEs in group A to be provided to CLOEs in group B, and vice versa. In other words, some of the bits received on path 901 may be provided on path 903, and some of the bits received on path 902 may be provided on path 904. Without the byte swapping operation, the data received on path 901 may be sent on path 904 only, and the data received on path 902 may sent on path 903 only. An example implementation of byte swapper 907 is described below with reference to FIG. 10.

II. 11. Byte Swapper

Figure 10:
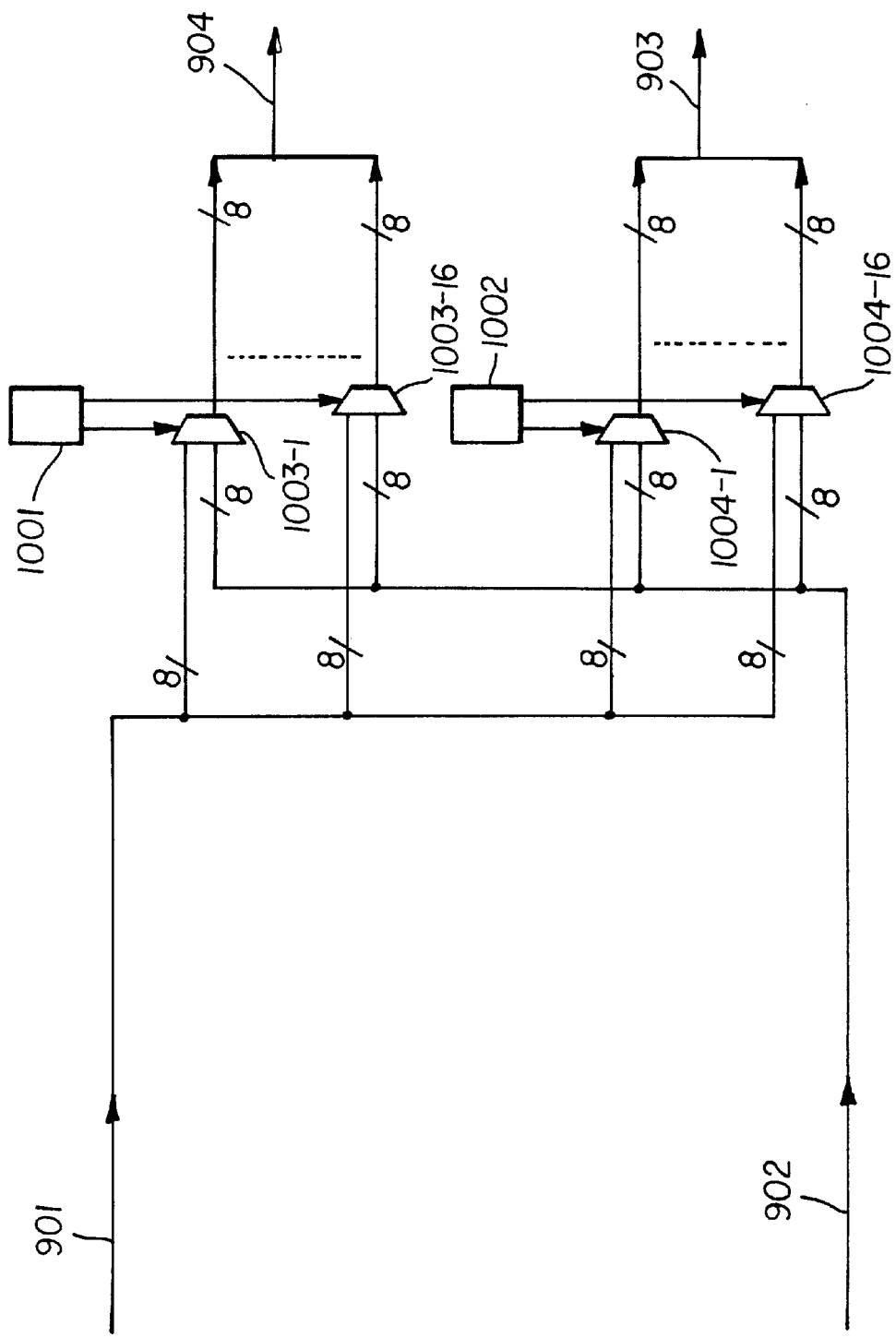
FIG. 10 is a block diagram of an example embodiment of a byte swapper.

FIG. 10 is a block diagram illustrating an example implementation of byte swapper 907. Example embodiments of RASD allowing for such storage techniques are described below in further detail. Byte swapper 907 may contains multiplexors 1003-1 through 1003-16 controlled by stack 1001, and multiplexors 1004-1 through 1004-16 controlled by stack 1002.

Each multiplexor 1003-1 through 1003-16 receives eight bits from path 901 and either bits from path 902, and selects one of the eight bit groups as specified by the data received from stack 1001. Stack 1001 may be configured by CLOG 210 according to the partitioning and the desired substitution of data bits. Thus, path 904 may contain the eight bit groups from either path 901 or path 902.

Similarly, multiplexors 1004-1 through 1004-16 may be operated to select eight bits groups from either path 901 or path 902. As a result, the CLOEs related to either group may have access to the output bits generated by CLOEs in other groups. Accordingly, the present invention can be extended to operate in conjunction with integrated circuit designs containing a large number of gates. The description is continued with reference RASDs.

II. 12. Random Access Storage Device (RASD)

RASD 320 is generally a memory device that provides for random access to its contents. Typical devices that fall into this category are SRAM, SSRAM, DRAM, SDRAM, SGRAM, FLASH, EPROM. RASD 320 is used to store the truth table for any given combinatorial function that needs to be evaluated. By using the inputs to the combinatorial function as the address lines to RASD 320, one can perform the evaluation by reading the data stored in the truth table. The address lines to RASD 320 are controlled by XCON 310. The evaluation output from RASD 320 is used by XCON 310.

For a high throughput performance, an embodiment of the RASD 320 is implemented using synchronous Static Random Access Memory (SRAM) having 256K locations, with each location having 32 bits. The 256K locations can be divided into a maximum of 16K clusters each with 16 words of 32 bits each. With this configuration a single cluster can store truth table outputs for four 4 input functions. By using RASDs that have an access time of 12 Ns (nanoseconds) a single access and exchange of information between neighboring CLOEs can be accomplished in 20 Ns. This translates to a machine cycle of 20 Ns and a system frequency of 50 MHZ.

For a target design that uses the entire 16K clusters, this may translate to 16K×20 Ns=320K Ns. This may translate to 3120 HZ of verification speed. If the target design required only 4K clusters, the verification speed would be 12,480 HZ.

It should be understood that the above described embodiments are provided here merely for illustrations. Several variations to these embodiments can be implemented without departing from the scope and spirit of the present invention as will be apparent to one skilled in the relevant arts based on the disclosure herein. Embodiments with such variations are contemplated to be within the scope and spirit of the present invention.

III. Trace Features

III. A. General Introduction

Tracing is often an important feature for the effective use of functional verification systems. Tracing generally allows a user to monitor the program flow and/or the states (values) of different signals. Thus, one requirement of function verification systems is that the users to be able to capture the state of certain signals in the target design.

Furthermore, it is often helpful for a user to know whether a particular signal has reached the possible '0' and '1' states. This information allows the user to determine what portion of the design is being exercised.

In addition, the captured values may then need to be displayed on a workstation for the user to debug the target design. Also, the trace features should not at least substantially impede the verification speed.

As described below in further detail, the present invention provides such features without at least substantially degrading the verification speed.

III. B. Trace Control Unit

Figure 11:
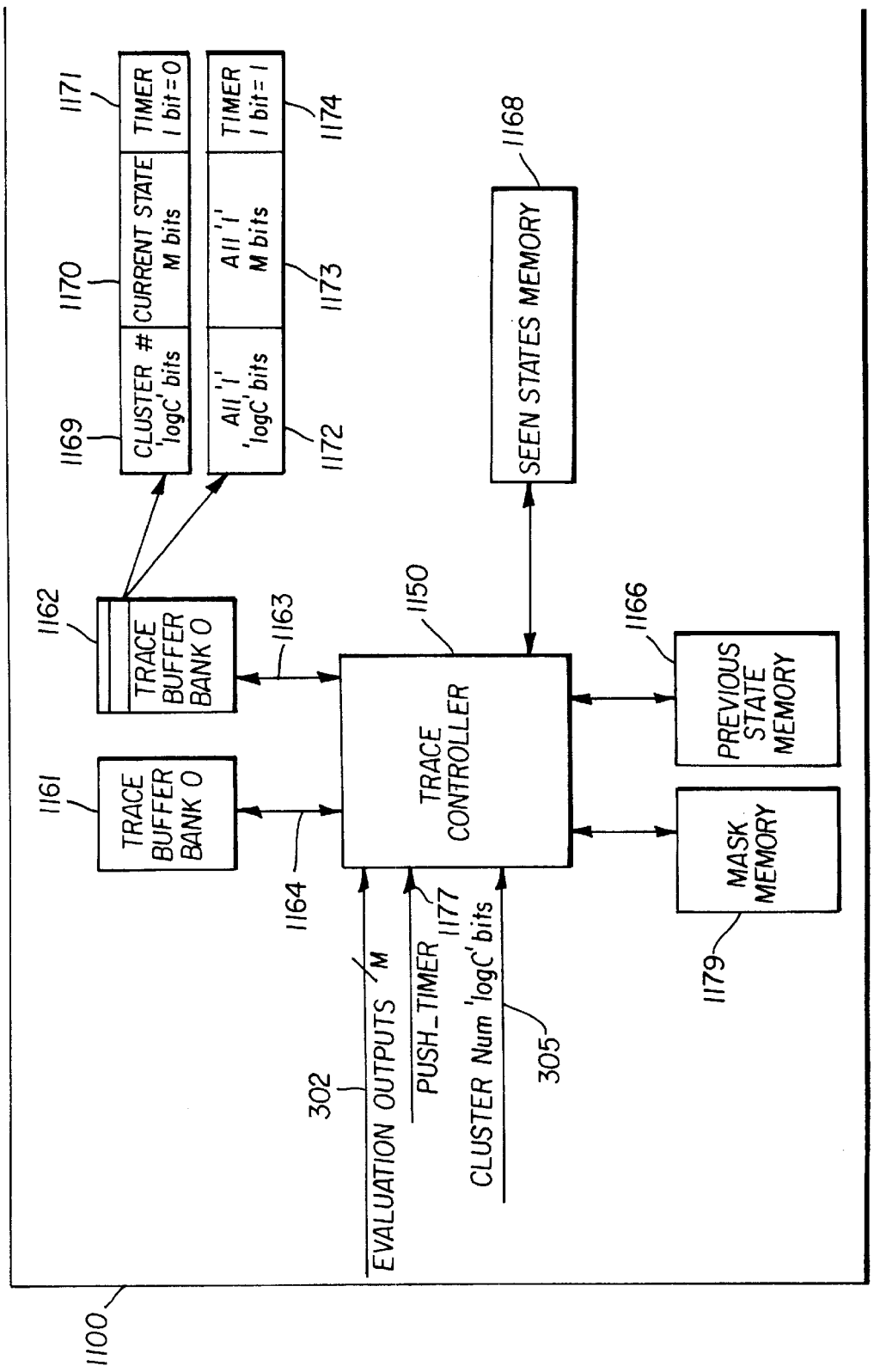
FIG. 11 is a block diagram of an embodiment of trace control unit enabling various trace features in accordance with the present invention.

FIG. 11 is a block diagram of an embodiment of trace control unit 1100 in accordance with the present invention. Trace control unit 1100 may need access to the information on bus 302 (shown in FIG. 4), and may thus be located as an independent unit external to RTC 225 and CLOEs 223. As may be appreciated, trace control unit 1100 may operate in parallel to and independent of the evaluation units (the CLOEs), and thus the evaluation speed may not be affected by the tracing operations. Trace control unit 1100 may contain trace controller 1150, multiple banks of the trace buffer 1161 and 1162, previous state memory 1166, seen states memory 1168, mask memory 1179. Each component is described below in further detail.

Mask memory 1179 may contain C (equal to the number of clusters) locations, with each location being M bits wide. Each location indicates whether a corresponding signal (output) is being traced. Thus, mask memory 1179 indicates the specific outputs of combinatorial blocks presently being traced.

Previous state memory 1166 may also contain C locations, with each being M bits wide. Each bit indicates the previous state of the output of combinatorial blocks presently being traced. In other words, only the bit locations indicated by mask memory 1179 may be used.

Seen states memory 1168 may also contain C locations, with each location containing 2×M bits. That is, each traced signal may have two associated bits. The bits are used to indicate whether a corresponding signal (evaluation output usually) has reached a '0' state, a '1' state or both states. In one embodiment, the two bits are initialized to a value of '00' respectively. The second bit is set to a 1 if the signal has attained a value of logical 0, and the first bit is set to a 1 if the signal has attained a value of logical 0. Thus, if the two bits respectively are in a state of 11, the signal may be deemed to have attained both the states of '0' and '1'.

Trace buffer banks 1161 and 1162 may contain many locations, with each location having sufficient number of bits to store the cluster number (Log C) and the M bits associated with the cluster number. Whenever a change in signal value is noticed, the corresponding Log C bits and M bits may be stored in one of the trace buffers. By using two banks, changes may be recorded while the recorded data is retrieved in parallel. As used in the present application, a trace buffer may refer to any type of storage used to save the tracing related data.

In addition to the (Log C+M) bits, a timer bit may be provided with each location of a trace buffer. The bit may be used to indicate whether the corresponding entry is stored in response to a change in the status of a signal or due to the assertion of push timer 1177. Push timer 1177 is asserted when the status of all the signals is to be ascertained. In response, the timer bit is set to 1 in a new entry in the trace buffer. The entries preceding the new entry may be analyzed to determine the status of the various signals at that point in time. The timer bit may be set to zero when the entry is created in response to a change in the signal status.

Trace controller 1150 operates in conjunction with the other components to provide various trace features in accordance with the present invention. The operation and implementation of trace controller 1150 will be clearer from the description of various features provided in accordance with the present invention.

III. C. Tracing Different Signals

The manner in which different signals (or outputs of combinatorial blocks) may be traced is described with reference to the flow chart of FIG. 12. The method of FIG. 12 may operate in conjunction with FIGS. 2 and 11. The flow chart begins in step 1201, in which control immediately passes to step 1210.

In step 1210, CLOG 210 may setup mask memory 1179 to indicate the specific signals to be traced. As noted above, mask memory 1179 may contain as many locations as the number of clusters, and each location may contain M bits equal to the number of bits received in each cluster cycle. Thus, the bit positions in mask memory 1179 which correspond to the specific signals to be traced may be set to 1, and the other bits may be set to 0.

In step 1220, CLOG 210 may initialize previous state memory 1166 with any initialization values. The initialization values generally depend on the specific target design presently being verified. In step 1230, trace controller 1150 may receive cluster number and evaluation outputs on 305 and 302 respectively.

In step 1240, trace controller 1150 may retrieve the content of a memory location with an address equal to the cluster number (received on path 305) from each of mask memory 1179 and previous state memory 1166. The value retrieved from previous state memory 1166 is compared with the evaluation outputs on a bit-bit basis. Only the bits indicated to be traced by the content retrieved from mask memory 1179 may need to be compared and considered.

In step 1250, based on the comparison of the bits indicated by mask memory 1179, trace controller 1150 determines whether a signal state has changed. If at least one bit has a different value from the previous value stored in previous state memory 1166, a change is determined to have occurred. If a signal change is present, control passes to 1270, or else control passes to step 1230.

In step 1270, the change of status is logged in a suitable place for later examination. In an embodiment, trace controller 1150 stores the cluster number and present status in trace buffer 1161. The timer bit in the trace buffer is set to 0 to indicate that the entry was created due to a change in the status (as opposed to due to the assertion of push timer 1177. Using the entries in trace buffer 1162, one may check whether the signal status has changed as expected.

Thus, an aspect of the present invention enables different signal values to be traced. Another aspect of the present invention provides information as to whether a signal has reached all possible states (0 and 1) as described below in further detail.

III. D. Tracing Whether a Signal has Reached/Attained all Possible States

Figure 13:
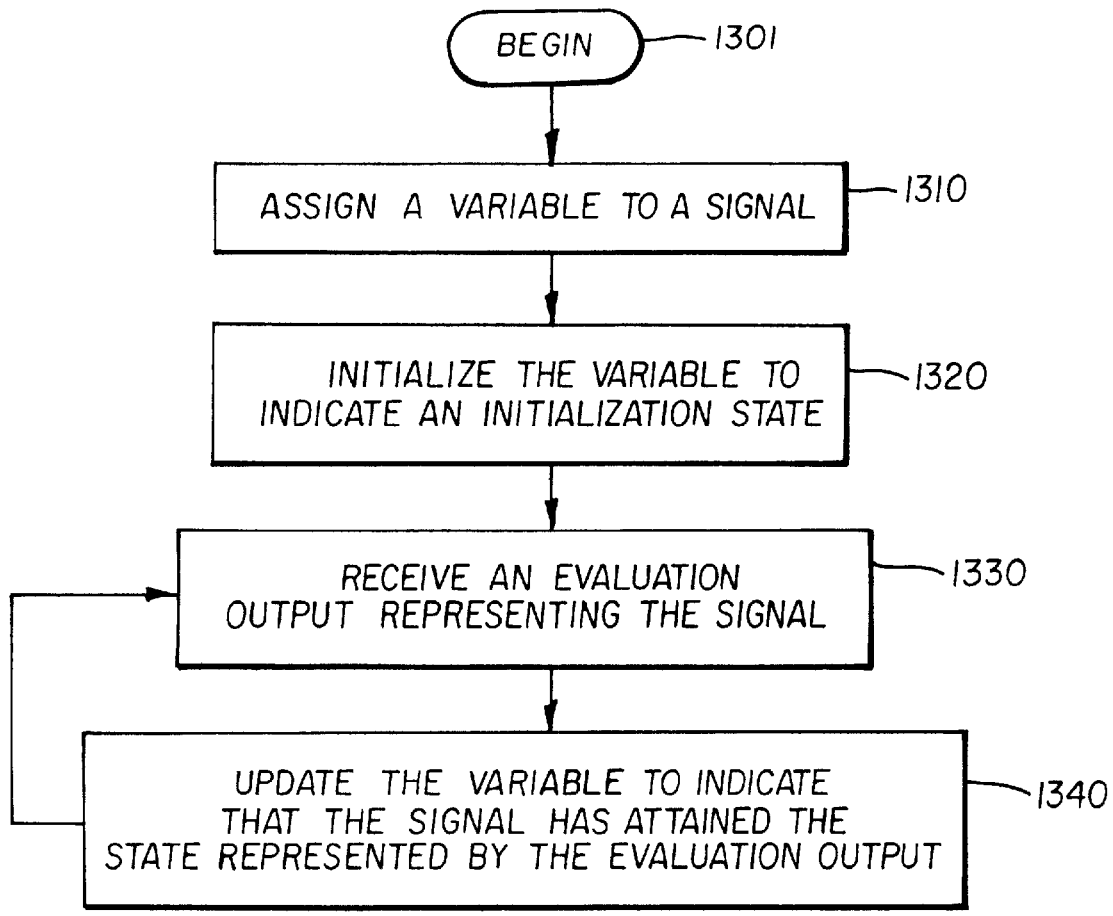
FIG. 13 is a flow chart illustrating a method which allows a determination of whether a signal has reached all the possible states.

FIG. 13 is a flow chart illustrating as method which allows a determination of whether a signal has reached all the possible states. The method begins in step 1301, in which control passes to step 1310. In step 1310, a variable is assigned to a signal, with the variable having sufficient number of values to indicate whether the signal has reached all possible states. As noted above, in one embodiment, a two bit value is chosen for the variable, with the value 00 indicating that the signal has not been evaluated yet, 01 indicating that the signal has attained a value of 0 at some point, 10 indicating that the signal has attained value of 1, and 11 indicating that the signal has reached both the possible states.

Figure 12:
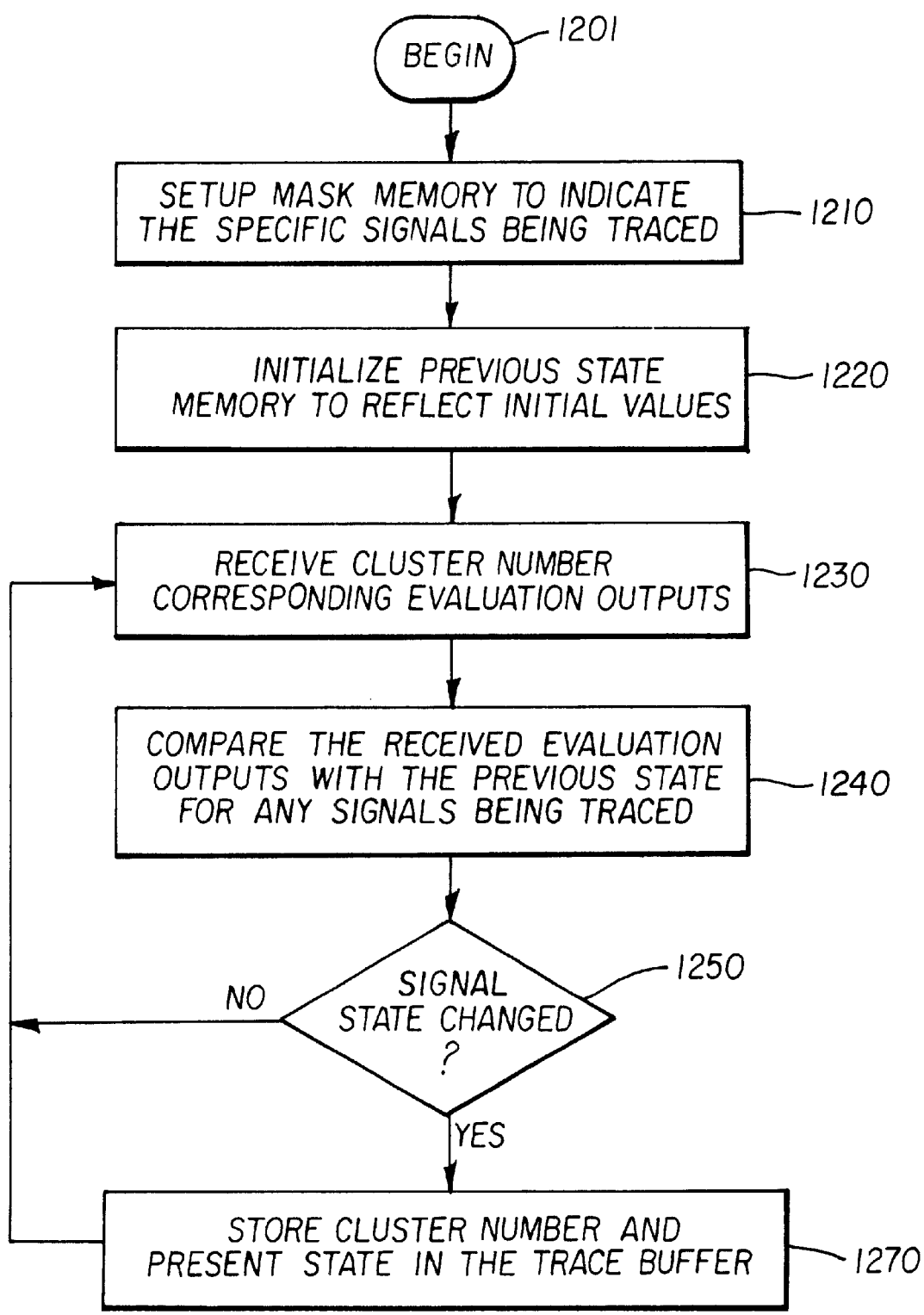
FIG. 12 is a flow chart illustrating a method which allows different signals (or outputs of combinatorial blocks) to be traced.

With reference to FIG. 12, seen states memory 1168 may provide the two bits for each signal. The location of the two bits are determined by the cluster number and the specific bit positions the signal is expected to be received on bus 302. CLOG 210 may set the two signals to 00 to indicate that the corresponding output has not yet been evaluated.

In step 1330, trace controller 1150 may receive an evaluation output representing the signal, with the signal being identified by cluster number 305 and the bit position on evaluation outputs 302.

In step 1340, trace controller 1150 may update the seen states memory 1168 to reflect that the signal has attained the state corresponding to the output value. That is, if the evaluation output is a 0, the least significant bit is updated to equal 1; and if the evaluation output is a 1, the most significant bit is updated to equal 1.

Steps 340 and 350 may be repeated for each evaluation output received on bus 302. By examining the contents of seen states memory 1168, one may determine whether a signal of interest has attained all the possible states.

Thus, the present invention provides several trace features which can be conveniently used in functional verification. A functional verification system may provide several other features such as those commonly associated with simulation as described below in further detail.

IV. Simulation Features

IV. A. General Introduction

Functional verification systems often need to provide support for several features, at least in simulation environments. One such feature is the simulation of a memory, which generally entails accessing the memory locations. The memory locations may be accessed for reading from or writing to the memory.

The memory read operations may be performed, for example, when data generated external to the verification system is provided as an input to the functional verification system. The memory write operations may be performed, for example, when the value corresponding to a variable stored in the memory is generated in the process of functional verification. Some of the times, the access address may itself be generated during the verification process.

When a desired data is read from a memory, it may be necessary to provide the data as an input for further evaluations. There may be other situations when data not generated from prior evaluations, is to be provided as an input for further evaluations. For example, the data may be provided from a system (e.g., CLOG 210) external to the functional verification system. The data may need to be provided at an appropriate time. Similarly, it may be necessary to provide the desired outputs resulting from evaluation immediately to an external system.

Another feature that may be important in a simulation environment is the ability to control the flow of the simulation. Such controlling may be necessary, for example, to generate a 'break point' during the simulation process. A break point generally refers to stopping the simulation process on the occurrence of a pre-specified event (e.g., change in the value of a variable of after the evaluation of a specific combinatorial block) such that the state of different variables of interest (or state of the simulated design) may be examined immediately after the occurrence of the event.

As described with example embodiments below, RTC 250 may be designed to provided several of the features typically required in simulation environments.

IV. 2. Run Time Controller (RTC)

Figure 14:
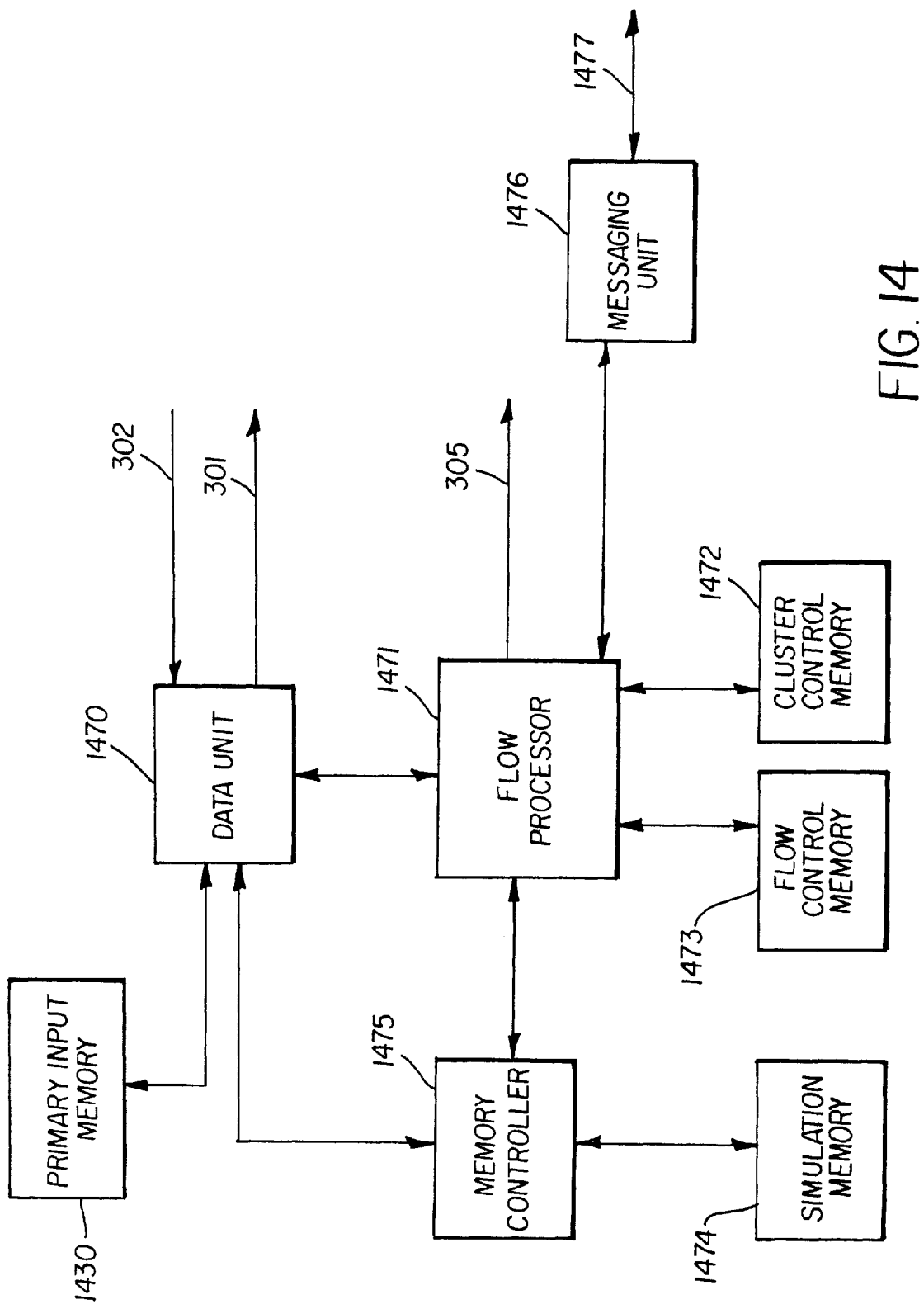
FIG. 14 is a block diagram of a run time controller illustrating several simulation features which can be provided in accordance with the present invention.

FIG. 14 is a block diagram illustrating an example embodiment of RTC 250 in accordance with the present invention. RTC 250 may contain primary input memory 1430, flow processor 1471, memory controller 1475, simulation memory 1474, data unit 1470, messaging unit 1476, flow control memory 1473, and cluster control memory 1472. Each component is described below in further detail.

Primary input memory 1430 may be used to provide any primary inputs of the target design. Primary inputs generally refer to the external inputs to the target design. In one embodiment, primary input memory 1430 is implemented as a FIFO (first in first out) and CLOG 210 (connection between primary input memory 1430 and CLOG 210 not shown) writes the primary inputs consistent with the partitioning and the expected evaluation sequence. Thus, the primary inputs are provided to data unit 1470 for injection onto bus 302.

Data unit 1470 receives the evaluation outputs on path 302, and provides the inputs for future evaluation on bus 301. The data received on path 302 may immediately be provided on bus 301 unless data is to be injected from other sources. Messaging unit 1476, primary input memory 1430 and simulation memory 1474 are examples of such sources as described below in further detail. In one embodiment, data unit 1470 may contain an injection register (not shown), and the data in the injection register is transferred to bus 301 under the control of flow processor 1471.

Simulation memory 1474 represents a memory storing data which is used in a simulation process in accordance with the present invention. Memory controller 1475 controls the access to simulation memory 1474. The address of the specific memory location to be accessed may be provided either from flow processor 1471 or from data unit 1470 as described below in further detail.

Messaging unit 1476 provides an interface with CLOG 210 (or any external system) to send and receive data. The specific data sent/received, and the time of data transfer may be specified by flow control memory 1473 and cluster control memory 1472 as described below with an example. Flow control memory 1473 and cluster control memory 1472 may be configured by CLOG 210.

Flow control memory 1473 contains flow control instructions, which specify the sequence in which different clusters are to be evaluated. Typically, each flow control instruction specifies a start cluster number and an end cluster number. The flow control instructions may be implemented to support conditions, which means that a sequence of clusters identified by a start cluster number and an end cluster number are executed only upon the satisfaction of the associated condition. The condition may be based on the contents of a condition register as described below.

Cluster control memory 1472 may contain the same number of locations as the number of clusters supported in the functional verification system. That is, the specific action to be taken associated with each cluster may be specified in cluster control memory 1472. In one embodiment, each memory location of cluster control memory 1472 may contain eight bits which may be interpreted as described below.

Bits 1–3 may specify the manner in which the evaluation outputs received on path 302 are to be interpreted. Specifically bit 1 may indicate whether the received data is to be interpreted as a memory address of simulation memory 1474, from which data is to be read. Bit 2 may indicate whether the data received on path 302 is to be used as a memory address and data to write into simulation memory 1474. Bit 3 may indicate whether the received data is to be provided to messaging unit 1476.

Bits 4–6 relate to injection of data onto bus 301. Bit 4 indicates whether data is to be read from simulation memory 1474. The address for the read may be provided to memory controller 1475 prior to the evaluation of the corresponding cluster. Bit 5 indicates that data is to be read from messaging unit 1476. Bit 6 indicates whether a primary input is to be retrieved from primary input memory 1430. All the data read due to bits 4–6 is stored in the injection register. Bit 7 specifies when (the specific machine cycle) the data stored in the injection register is to be transferred on bus 301. Bit 7 may be used in conjunction with bits 4, 5, or 6, or by itself.

In one embodiment, injection register contains 32 bits, and all storage and retrieval operations are performed as 32 bit words. That is, if data received on path 302 is to be stored in simulation memory 1474, 32 of the received bits are stored. The same is true with reference to retrieval operation also and with respect to messaging unit 1476 also.

The address for storage/retrieval may some times be provided by flow processor 1471 (as configured by CLOG 210). Some other times the location address of simulation memory 1474 may be received on path 302. In an embodiment, simulation memory 1474 may be implemented to have 28 address bits, with each memory location containing 32 bits. Of the 32 bits received as an address, 28 bits are used as memory location address, and the remaining 4 bits may be used to address the byte position.

Continuing with the description of the contents of cluster control memory 1472, each memory location may have the ability to specify that a particular bit position of path 302 is to be saved into a condition register (or specific bit in the condition register). The flow control instructions in flow control memory 1473 may be designed to examine the contents of the condition register, and take appropriate actions. For example, different flows (execution paths) may be chosen depending on the contents of the condition register.

Flow processor 1471 executes the flow control instructions stored in flow control memory 1473 to determine a specific cluster to evaluate. The corresponding cluster identifier (and cluster valid signal) may be sent on path 305. As noted above, some of the instructions may alter the flow of execution.

Along with sending a present cluster number on path 305, flow processor 1471 may process the instructions in cluster control memory 1472 at the location corresponding to the present cluster number. As noted above, the data in cluster control memory 1472 may cause data to be stored and retrieved from various components. The ability to specify the cluster numbers using flow control memory 1473, and to cause different actions to be performed by using cluster control memory 1472 enables flow processor 1471 to provide several features of the present invention as described below in further detail.

IV. 3. Read Access During Memory Simulation

Figure 15:
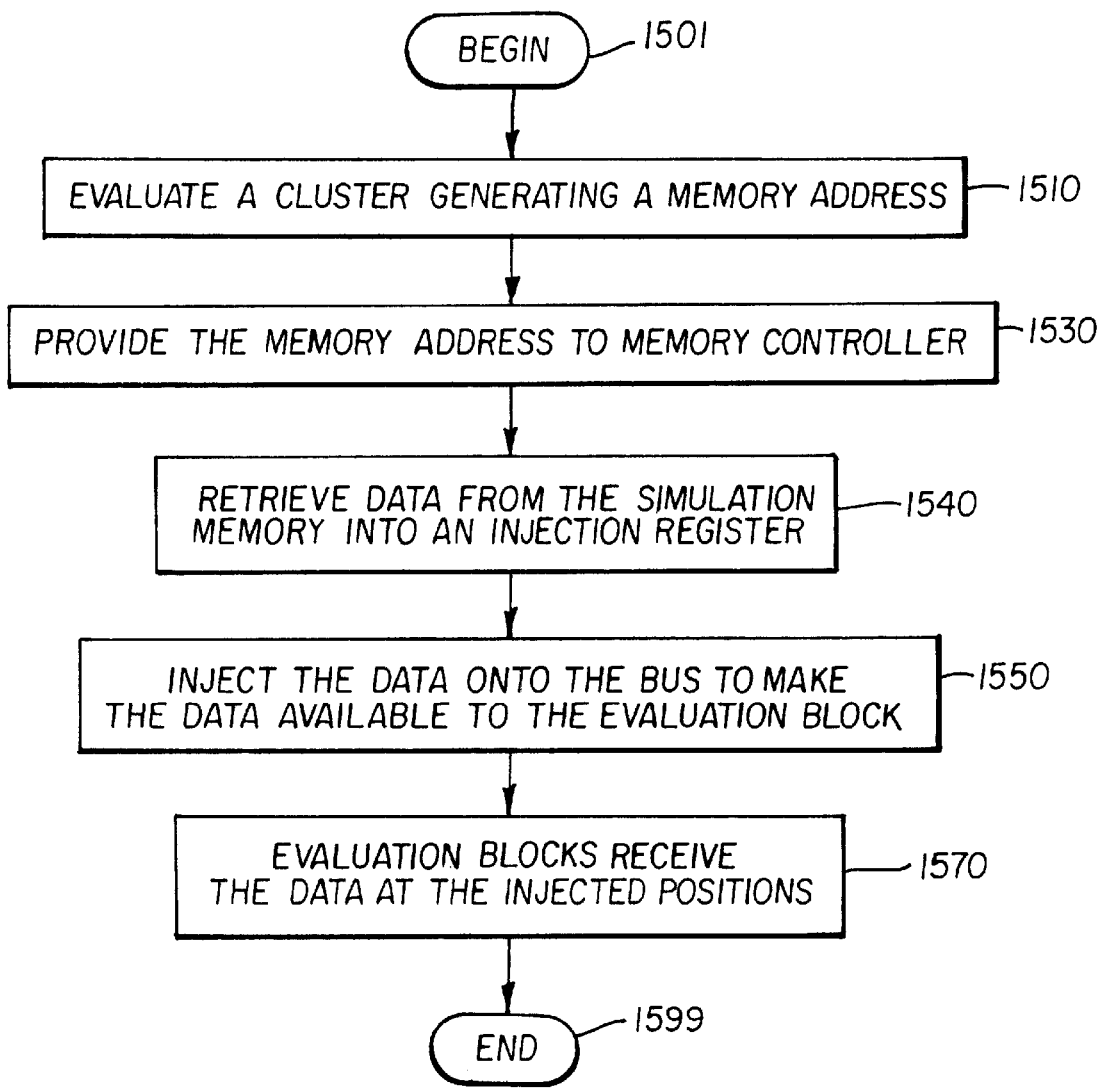
FIG. 15 is a flow chart illustrating a method using which a memory may be simulated during functional verification in accordance with the present invention.

FIG. 15 is a flow-chart illustrating a method which enables a read access to be performed during a memory simulation. The method is described with respect to the following pseudo-code:

Content of flow control memory 1473:

RUN start_cluster_block end_cluster_block    (P1)

Content of Cluster control:

Cluster N, start_cluster_block<=N<end_cluster_block bit (1) above is set    (P2)

Cluster M, N<M<=end_cluster_block: bits (4) and (7) are set(P3)

In step 1510, flow processor 1471 retrieves a flow control instruction (shown as P1 above) from flow control memory 1473 and executes the instruction to cause a cluster (cluster number N) generating an address of the memory location to be evaluated. As a result, the address is received on path 302. In one embodiment, all the 32-bits forming an address are received in a single clock cycle. The 32 bits may be received in pre-specified fixed bit positions for simplicity of implementation.

In step 1530, the memory address may be provided to memory controller 1475. In the location corresponding to cluster N (the cluster initiating the evaluations resulting in the generation of the memory address), bit (1) is set to 1 to cause the data on path 302 to be interpreted as a memory address. The interpretation may be performed a few clock cycles after the initiation of evaluation of cluster N to account for the pipeline delay between initiating the evaluation of the cluster generating the address and the time the address is available on path 302.

In one embodiment, a base address may be generated for each of a different partitions of a target design, and the base address may be provided based on an instruction stored in flow control memory 1473. Only the offset may be received from path 302. Memory controller 1475 may be designed to generate the eventual memory address based on such a base address and offset.

In step 1540, the data retrieved from simulation memory 1474 is stored into an injection register when the evaluation of cluster number M is initiated as bit 4 of the corresponding location in cluster control memory 1472 is set to 1. In step 1550, the data in the injection register is injected (inserted/provided) on bus 301. The data may be injected along with the initiation of cluster number M as bit 7 of the corresponding memory location in cluster control memory 1472 is also set to 1.

In step 1550, the evaluation blocks which are to receive the data from the simulated memory receive the data. Specifically, the muxkongs may be configured a priori to receive the bits at the injected bit positions. Accordingly, a memory read may be simulated in accordance with the present invention.

IV. 4. Write Access During Memory Simulation

The write access is described with respect to the following pseudo-code:

Content of flow control memory 1473:

RUN start_cluster_block end_cluster_block    (P4)

Content of Cluster control:

Cluster N, start_cluster_block<=N<end_cluster_block bit (2) is set    (P5)

In the case of a write operation, the evaluation blocks may be designed to generate a memory address and the corresponding data in the same machine cycle. Accordingly, bit (2) of the memory location corresponding to cluster number N (expected to generate a write operation) in the cluster control memory 1472 may be set to 1.

When flow processor 1471 initiates the evaluation of cluster N, the memory location in cluster control memory 1472 is examined and the memory address and data are retrieved from data unit 1470. The retrieved data is provided to memory controller 1475 for storage in simulation memory 1474.

Even though the memory address and data are described as being received in a single machine cycle, it should be understood that both can be designed to be received in different clock cycles. In such a situation, cluster control memory 1472 and flow control memory 1473 may need to be designed accordingly. Thus, a write operation may be supported by a functional verification system provided in accordance with the present invention.

IV. 5. Communications with Messaging Unit

As noted above, the primary inputs (the inputs to target design) may be provided from external to the functional verification system. These inputs may be provided using messaging unit 1476. Similarly, messaging unit 1476 may be used to send results generated from evaluation of various blocks. The data may be received from and transferred to messaging unit 1476 in accordance with the present invention as described below in further detail.

A sequence of words may need to be read in continuous clock cycles and provided to different evaluation units. The words may be provided from messaging unit 1476. Assuming that the words are available during successive clusters $N_1$ through $N_Q$ (Q being an integer),the words may be provided to the evaluation units using the following pseudo-code:

Contents of flow control memory 1473:

RUN start_cluster_block end_cluster_block    (P6)

Contents of cluster control memory 1472:

For each cluster $N_J$(J=1 to Q), set bits (5) and (7) to 1    (P7)

As may be readily appreciated, bit (5) causes the data available from messaging unit 1476 to be read into the injection register, and bit 7 causes the data in the injection register to be sent on bus 301. According to one convention, the bits may be sent in fixed bit positions on bus 301, and each evaluation block may be designed to select the desired bits according to the respective combinatorial blocks being evaluated. Thus, any length of data bit stream may be passed from messaging unit 1476 to the evaluation blocks.

With respect to sending any data from the evaluation blocks to messaging unit 1476, the clusters which generate the data to be sent may be determined according to the partitioning. Assuming that clusters $N_1$ through $N_R$ (R being an integer) generate the data to be sent to messaging unit 1476, the following pseudo-code may be used with reference to the embodiments described above:

Contents of flow control memory 1473:

RUN start_cluster_block end_cluster_block    (P6)

Contents of cluster control memory 1472:

For each cluster $N_J$(J=1 to R), set bit (3) to 1    (P7)

As bit (3) for the clusters NJ causes the data from path 302 to be transferred to messaging unit 1476, the data generated by the evaluations can be sent to any systems external to the functional verification system. Thus, the data can be transferred between messaging unit 1476 and the evaluation blocks in both directions in accordance with the present invention.

Another feature the present invention enables both cycle based and non-cycle based designs to be verified. The non-cycle based designs offer more specific challenges because of the possibility of loops without a memory element and accordingly the feature is described below with reference to non-cycle based designs.

V. Non-Cycle Based Design

V. 1. General Introduction

A non-cycle based design generally refers to a target design which contains combinatorial logic loops, that is, loops without a memory element (such as a flip-flop) in between. The presence of the loops poses special challenges in functional verification. Typically, the loop needs to be evaluated until a condition is satisfied. Examples of such conditions are all the logic elements (e.g., gates) reaching a steady-state, a loop being evaluated a certain number of times, etc. A steady state is said to be attained when all the elements of a combinatorial logic loop remain at the same respective logic values even if the elements are reevaluated. An aspect of the present invention allows the functional verification of non-cycle based designs also as described below in further detail.

V. 2. Run Time Controller Support for Verification of Non-Cycle Based Design As noted above, the verification of non-cycle based designs may require evaluation of elements forming a loop until a condition is attained. To determine whether a condition associated with a loop is attained, multiple registers may be maintained within flow processor 1471. To determine whether a loop has been executed a certain number of times, counters (an example of a register) may be maintained. Each counter may be decremented/incremented and examined based on the flow control instructions stored in flow control memory 1473. The evaluation flows can be controlled based on the values in the counters.

Similarly, condition registers (bits) may also be provided within flow processor 1471. The registers may also be set to various values and be examined, which form s the basis for controlling the evaluation sequence. In one embodiment, a single register containing four bits is maintained with each bit being associated with specific bit positions on path 302. Bits 8–11 of cluster control memory 1472, if set, respectively cause bits in fixed positions (e.g., 1, 32, 64 and 128 respectively) to be stored in the respective condition bits.

The contents of flow control memory 1473 (and cluster control memory 1472) may be designed accordingly by CLOG 210. If the evaluation of a cluster generates bits ("evaluation bits") which bear upon the condition corresponding to the condition bits, the evaluation bits are provided in bit position 1, 32, 64 and/or 128 respectively. The specific bits 8–11 of the corresponding memory location are set to 1. The instructions in flow control memory 1473 may be set to examine any of the condition bits. Two bits may be needed to select from among the four condition bits during examination.

The manner in which non-cycle-based design can be verified according to an aspect of the present invention is described below in further detail.

V. 3. Method

Figure 16:
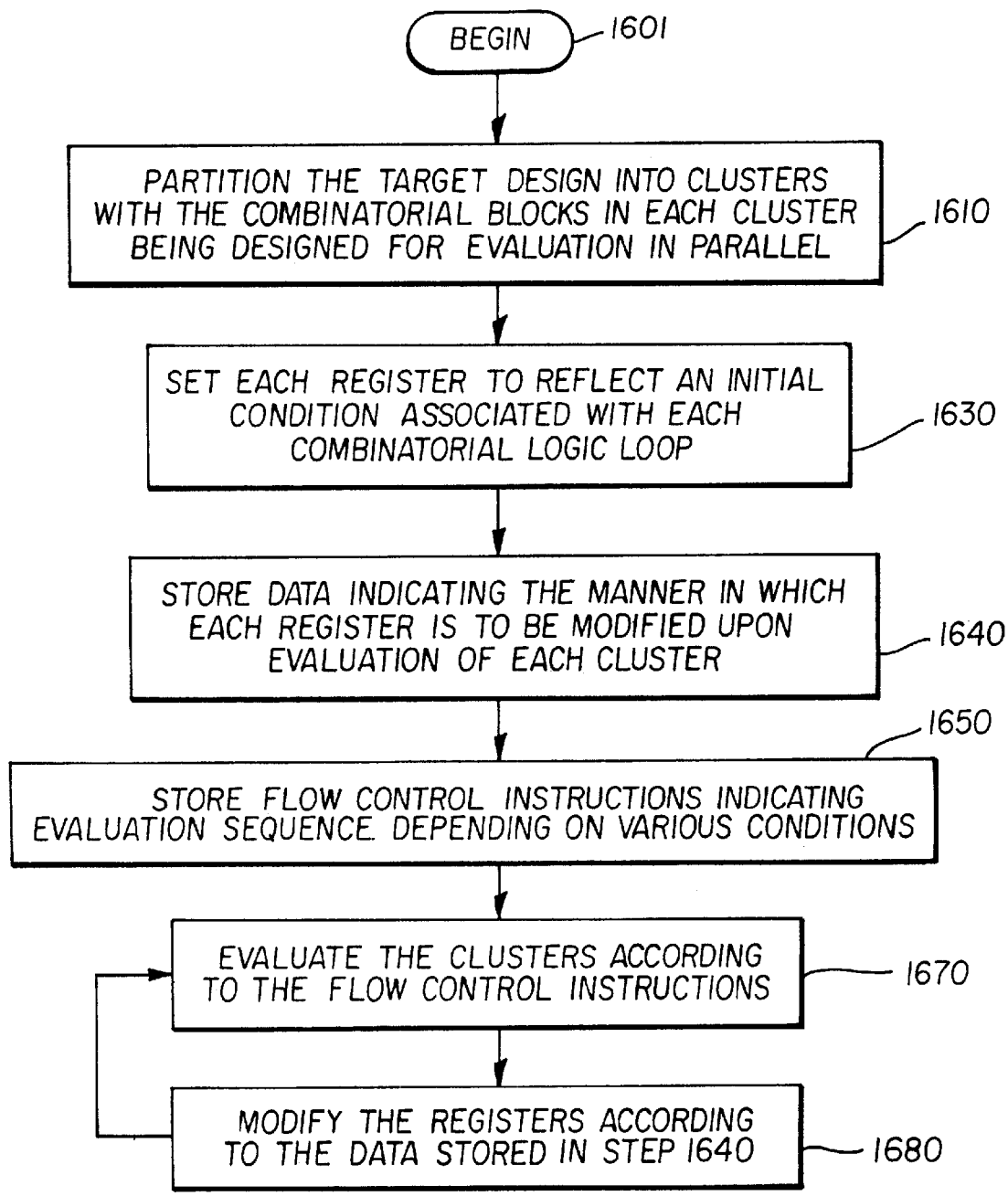
FIG. 16 is a flow chart illustrating a method using which cycle based designs can be verified in accordance with the present invention.

FIG. 16 is a flow chart illustrating a method according to which the functional verification of a non-cycle based design can be performed.

The method begins in step 1601 in which control passes to step 1610. In step 1610, the non-cycle based design is partitioned into clusters with the combinatorial blocks in each cluster being designed for evaluation in parallel. Each of the combinatorial blocks in a given cluster may be evaluated by different evaluation units as described above in detail.

In step 1630, each register (counter and conditional bits in the described embodiments) may be set to reflect an initial condition. For example, if a loop is to be evaluated 20 times, a corresponding counter may be set to 20. Similarly, a condition bit may be set to 0 if such can be determined to be an initial condition. Alternatively, two bits may be used as in seen states memory 1168 to be able to reliably determine whether a change has occurred for a specific signal.

In step 1640, data is stored indicating the manner in which each register is to be modified upon the evaluation of a cluster. In the case of the embodiment of FIG. 14, cluster control memory 1472 is made to indicate the manner in which conditional registers are modified. The counters may be modified based on instructions in flow control memory 1473.

In step 1650, flow control instructions may be stored in flow control memory 1473 indicating the different evaluation sequences depending on different states of the condition registers. It should be understood that steps 1610–1650 may be implemented using software within CLOG 210, and the four steps are inter-related.

In step 1670, the clusters are evaluated according to the flow control instructions stored in flow control memory 1473. In step 1680, the condition registers are modified as each cluster is evaluated according to the data stored in step 1640. For many of the clusters no modifications may be performed.

Steps 1670 and 1680 are performed until the functional verification is complete. It may be appreciated that the flow chart of FIG. 16 enables loops to be evaluated multiple times until a desired condition is attained. The ability to evaluate loops forms the basis for verification of non-cycle based designs. The evaluation of loops is described with a specific example in further detail below.

V. 4. EXAMPLE

The below pseudo code illustrates the manner in which loops may be evaluated until a desired condition (which can be a combination of many conditions) is attained. The code is described with reference to FIGS. 14 and 16 for further illustration.

Content of flow control memory 1473:

| | |
|---|---:|
| SET condition_bit N | (P8) |
| RUN start_cond_block end_cond_block | (P9) |
| IF condition_reg=0 JUMP label | (P10) |
| RUN start_cycle_block end_cycle_block | (P11) |
| label: . . . | (P12) |

Content of cluster control memory 1472:

Set bit (8) of one of the clusters

| | |
|---|---:|
| within start_cond_block . . . end_cond_block | (P13) |

It should be first noted that the contents of flow control memory 1473 and cluster control memory 1472 are set based on the partitioning of the non-cycle based target design. In P8, a condition bit (specified as N) is set to 1 reflecting an initial condition (step 1630). In P9, a sequence of clusters, for example numbered 150 (start_cond_block) to 287 (end_cond_block), are evaluated. One of the clusters may cause condition bit N to be set to 1 (due to P13) depending on a value generated based on the evaluation of a combinatorial block.

In P10, the status of the condition register is examined. If the condition register is set to 0, control passes to P12. Otherwise, evaluation continues with P11. It should be noted that the basic concept illustrated with respect to P8–P13 can be used to implement different loops, with the exit depending on different conditions. The loop evaluation provides the basis for verification of various non-cycle based designs.

VI. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of verifying a non-cycle based design containing at least combinatorial logic loop, wherein said combinatorial logic loop is to be evaluated until a condition is attained, said method comprising:

(a) partitioning said non-cycle based design into a plurality of clusters, wherein each of said plurality of clusters contains a plurality of combinatorial blocks capable of being evaluated in parallel by a plurality of evaluation units in response to receiving a cluster number uniquely identifying a corresponding cluster;

(b) setting a register to reflect an initial condition associated with said combinatorial logic loop;

(c) storing data indicating the manner in which said register is to be modified upon evaluation of a combinatorial block contained in said combinatorial logic loop;

(d) storing a plurality of flow control instructions indicating a sequence in which said plurality of clusters are to be evaluated depending on the status of said register, wherein at least one of said flow control instructions specifies when the evaluation of clusters representing said combinatorial logic loop is to end;

(e) sending each of a sequence of cluster numbers to said plurality of evaluation units to cause the combinatorial blocks in a corresponding cluster to be evaluated;

(f) modifying said register according to said data stored in (c); and (g) continuing (e) and (f) until the evaluation of said combinatorial logic loop ends, whereby said non-cycle based design is verified based on the evaluation of said combinatorial logic loop.

2. The method of claim 1, wherein said condition comprises evaluating said combinatorial logic loop a pre-specified number of times, wherein said register comprises a counter and (b) comprises storing a number representative of said pre-specified number, and (c) comprises decrementing said counter upon evaluation of said loop for each iteration, and wherein (d) comprises storing a flow control instruction which indicates said end when said counter indicates that said loop has been evaluated said pre-specified number of times.

3. The method of claim 2, wherein said flow control instruction is stored in a flow control memory along with said plurality of flow control instructions.

4. The method of claim 1, wherein said condition comprises receiving a specific value for a specific evaluation bit corresponding to one of said combinatorial blocks.

5. The method of claim 4, wherein (b) comprises setting a register bit in a register to indicate a value other than said specific evaluation bit, and (c) comprises indicating that said specific evaluation bit is to be stored in said register bit upon evaluation of said one of said combinatorial blocks, whereby the evaluation of said loop ends if said evaluation bit equals said specific value.

6. The method of claim 5, wherein (c) further comprises storing data in a cluster control memory containing a number of cluster memory locations equal to the number of said plurality of clusters, wherein each cluster memory location indicates whether an evaluation bit generated from evaluating a corresponding cluster is to be stored in said register bit.

7. A method of verifying a design containing at least combinatorial logic loop, wherein said combinatorial logic loop is to be evaluated until a condition is attained, said method comprising:

(a) partitioning said design into a plurality of clusters, wherein each of said plurality of clusters contains a plurality of combinatorial blocks capable of being evaluated in parallel by a plurality of evaluation units in response to receiving a cluster number uniquely identifying a corresponding cluster;

(b) storing a plurality of flow control instructions indicating a sequence in which said plurality of clusters are to be evaluated; and (c) sending each of a sequence of cluster numbers to said plurality of evaluation units to cause the combinatorial blocks in a corresponding cluster to be evaluated, whereby said design is verified.

8. The method of claim 7, wherein said design comprises a cycle-based design.

9. A verification system enabling functional verification of a non-cycle based design containing at least combinatorial logic loop, wherein said combinatorial logic loop is to be evaluated until a condition is attained, said verification system comprising:

means for partitioning said non-cycle based design into a plurality of clusters, wherein each of said plurality of clusters contains a plurality of combinatorial blocks capable of being evaluated in parallel by a plurality of evaluation units in response to receiving a cluster number uniquely identifying a corresponding cluster;

means for setting a register to reflect an initial condition associated with said combinatorial logic loop;

first storing means for storing data indicating the manner in which said register is to be modified upon evaluation of a combinatorial block contained in said combinatorial logic loop;

second storing means for storing a plurality of flow control instructions indicating a sequence m which said plurality of clusters are to be evaluated depending on a status of said register, wherein at least one of said flow control instructions specifies when the evaluation of clusters representing said combinatorial logic loop is to end;

means for sending each of a sequence of cluster numbers to said plurality of evaluation units to cause the combinatorial blocks in a corresponding cluster to be evaluated;

means for modifying said register according to said data stored by said means for storing, wherein said sending and modifying are continued until the evaluation of said combinatorial logic loop ends, whereby said non-cycle based design is verified based on the evaluation of said combinatorial logic loop.

10. The verification system of claim 9, wherein said condition comprises evaluating said combinatorial logic loop a pre-specified number of times, wherein said register further comprises a counter and said first storing means comprises storing a number representative of said pre-specified number, and said means for modifying further decrements said counter upon evaluation of said loop for each iteration, and wherein second storing means further stores a flow control instruction which indicates said end when said counter indicates that said loop has been evaluated said pre-specified number of times.

11. The verification system of claim 10, wherein said flow control instruction is stored in a flow control memory along with said plurality of flow control instructions.

12. The verification system of claim 9, wherein said condition comprises receiving a specific value for a specific evaluation bit corresponding to one of said combinatorial blocks.

13. The verification system of claim 12, wherein said means for setting further sets a register bit in a register to indicate a value other than said specific evaluation bit, and first means for storing further indicates that said specific evaluation bit is to be stored in said register bit upon evaluation of said one of said combinatorial blocks, whereby the evaluation of said loop ends if said evaluation bit equals said specific value.

14. The verification system of claim 13, wherein said first means for storing further stores data in a cluster control memory containing a number of cluster memory locations equal to the number of said plurality of clusters, wherein the data in each cluster memory location indicates whether an evaluation bit generated from evaluating a corresponding cluster is to be stored in said register bit.

15. A verification system enabling functional verification of a design, said verification system comprising:

a plurality of evaluation units, with each evaluation unit being capable of evaluating one of a plurality of combinatorial blocks within a cluster in response to receiving a cluster number identifying the corresponding cluster, a plurality of clusters together specifying said design including data dependencies;

a flow control memory storing a plurality of flow control instructions indicating a sequence in which said plurality of clusters are to be evaluated; and a flow processor sending a sequence of cluster numbers to said plurality of evaluation units to cause said design to be evaluated.

16. The verification system of claim 15, wherein said design comprises a non-cycle based design containing a loop, and said verification system further comprising a memory element storing data indicating a condition under which the evaluation of said loop is to be terminated.

17. The verification system of claim 16, further comprising a cluster control memory storing data indicating the manner in which said memory element is to be modified upon evaluation of said plurality of clusters, wherein said flow control memory stores data indicating a sequence in which said cluster numbers are to be sent depending on different values in said memory element, whereby the evaluation of said loop can be terminated by appropriate configuration of said flow control memory and said cluster control memory.

18. The verification system of claim 17, wherein said memory element comprises a register.

19. The verification system of claim 15, wherein said design comprises a non-cycle based design containing a loop, and said verification system further comprises:

a register storing a value; and a cluster control memory storing data indicating the manner in which said register is to be modified upon evaluation of said plurality of clusters, wherein said flow control memory stores data indicating a sequence in which said cluster numbers are to be sent depending on different values in said register, whereby the evaluation of said loop can be terminated by appropriate configuration of said flow control memory and said cluster control memory.

* * * * *